US009230652B2

(12) United States Patent
Jiang et al.

(10) Patent No.: US 9,230,652 B2
(45) Date of Patent: Jan. 5, 2016

(54) FLASH MEMORIES USING MINIMUM PUSH UP, MULTI-CELL AND MULTI-PERMUTATION SCHEMES FOR DATA STORAGE

(71) Applicants: California Institute of Technology, Pasadena, CA (US); Texas A&M University System, College Station, TX (US)

(72) Inventors: Anxiao Jiang, College Station, TX (US); Eyal En Gad, Pasadena, CA (US); Jehoshua Bruck, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 315 days.

(21) Appl. No.: 13/791,856

(22) Filed: Mar. 8, 2013

(65) Prior Publication Data

US 2013/0268723 A1    Oct. 10, 2013

Related U.S. Application Data

(60) Provisional application No. 61/608,245, filed on Mar. 8, 2012, provisional application No. 61/608,465, filed on Mar. 8, 2012.

(51) Int. Cl.
*G11C 16/04* (2006.01)
*G06F 12/02* (2006.01)
*G11C 11/56* (2006.01)

(52) U.S. Cl.
CPC ........ *G11C 16/0441* (2013.01); *G06F 12/0246* (2013.01); *G11C 11/5621* (2013.01); *G11C 11/5628* (2013.01); *G11C 11/5635* (2013.01); *G11C 16/0483* (2013.01); *H03M 2201/52* (2013.01)

(58) Field of Classification Search
CPC .......... H03M 2201/52; G11C 16/0441; G11C 11/5628; G06F 12/0246
See application file for complete search history.

(56) References Cited

U.S. PATENT DOCUMENTS

| 2009/0132758 | A1* | 5/2009 | Jiang et al. | 711/103 |
| 2009/0132895 | A1* | 5/2009 | Jiang et al. | 714/781 |
| 2012/0170626 | A1* | 7/2012 | Adachi | 375/219 |
| 2013/0121084 | A1* | 5/2013 | Jeon et al. | 365/185.24 |

OTHER PUBLICATIONS

Aritome et al., "Reliability Issues of Flash Memory Cells", *Proceedings of the IEEE*, 81(5):776-788 (May 1993).

(Continued)

*Primary Examiner* — Joseph D Torres
(74) *Attorney, Agent, or Firm* — Kilpatrick Townsend & Stockton LLP

(57) ABSTRACT

Rank modulation has been recently proposed as a scheme for storing information in flash memories. Three improved aspects are disclosed. In one aspect the minimum push-up scheme, for storing data in flash memories is provided. It aims at minimizing the cost of changing the state of the memory. In another aspect, multi-cells, used for storing data in flash memories is provided. Each transistor is replaced with a multi-cell of mm transistors connected in parallel. In yet another aspect, multi-permutations, are provided. The paradigm of representing information with permutations is generalized to the case where the number of cells in each level is a constant greater than one.

18 Claims, 14 Drawing Sheets

(56) References Cited

OTHER PUBLICATIONS

Barg and Mazumdar, "Codes in Permutations and Error Correction for Rank Modulation," *IEEE Transactions on Information Theory*, 56(7): 3158-3165 (Jul. 2010).

Cappelletti et al., "Memory Architecture and Related Issues" in *Flash Memories*, Kluwer Academic Publishers, 1st Edition (1999), 5:241-360.

En Gad et al., "Compressed Encoding for Rank Modulation," in *Proceedings of the 2011 IEEE Inernational Symposium on Information Theory Proceedings, ISIT2011*, St. Petersburg, Russia, pp. 884-888 (Aug. 2011).

Farnoud et al., "Rank Modulation for Translocation Error Correction," in *Proceedings of the IEEE International Symposium on Information Theory Workshop (ISIT)*, pp. 2988-2992 (Jun. 2012).

Fiat and Shamir, "Generalized "Write-Once" Memories," *IEEE Transactions on Information Theory*, IT-30(3):470-480 (May 1984).

Fu and Han Vinck, "On the Capacity of Generalized Write-once Memory with State Transitions Described by an Arbitrary Directed Acyclic Graph," *IEEE Transactions on Information Theory*, 45(1):308-313 (Jan. 1999).

Gal and Toledo, "Alogrithms and Data Structures for Flash Memories", *ACM Computing Surveys*, 37(2):138-163 (Jun. 2005).

Jiang et al., "Correcting Charge-Constrained Errors in the Rank-Modulation Scheme," *IEEE Transactions on Information Theory*, 56(5):2112-2120 (May 2010).

Jiang et al., "Rank Modulation for Flash Memories", *IEEE Transactions on Information Theory*, 55(6):2659-2673 (Jun. 2009).

Kløve, T., "Spheres of Permutations under the Infinity Norm—Permutations with limited displacement," *Reports in Informatics from Department of Informatics*, University of Bergen, Bergen, Norway, Tech. Rep. 376, (Nov. 2008), 38 pages (including cover sheet and citation sheet).

Pavan et al., "Flash Memory Cells—An Overview", *Proceedings of the IEEE*, 85(8):1248-1271 (Aug. 1997).

Rivest and Shamir, "How to Reuse a "Write-Once" Memory*," *Information and Control*, 55:1-19 (1982).

Tamo and Schwartz, "Correcting Limited-Magnitude Errors in the Rank-Modulation Scheme,"*IEEE Transactions on Information Theory*, 56(6):2551-2560 (Jun. 2010).

Wang and Bruck, "Partial Rank Modulation for Flash Memories," *Proceedings of the 2010 IEEE International Symposium on Information Theory (ISIT2010)*, Austin, TX, U.S.A., pp. 864-868 (Jun. 2010).

Wang et al., "On the Capacity of Bounded Rank Modulation for Flash Memories," *Proceedings of the 2009 IEEE International Symposium on Information Theory*, pp. 1234-1238 (Jun. 2009).

* cited by examiner

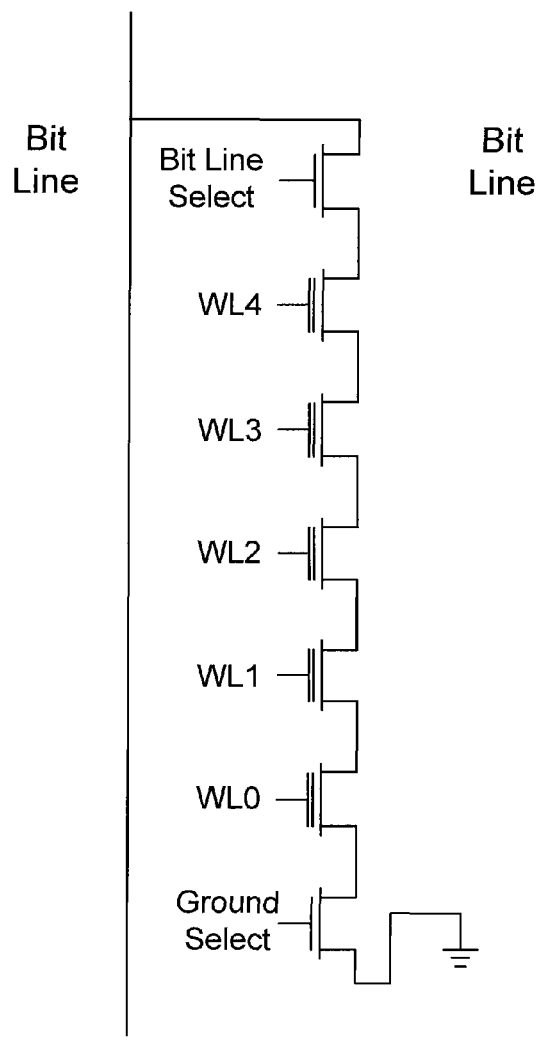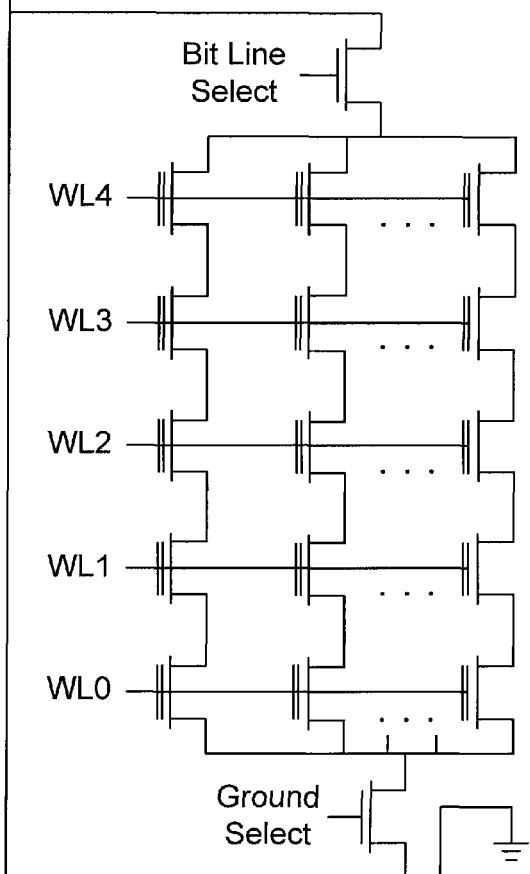
Traditional NAND flash structure
Multi-cell NAND flash structure
*FIG. 7A*  *FIG. 7B*

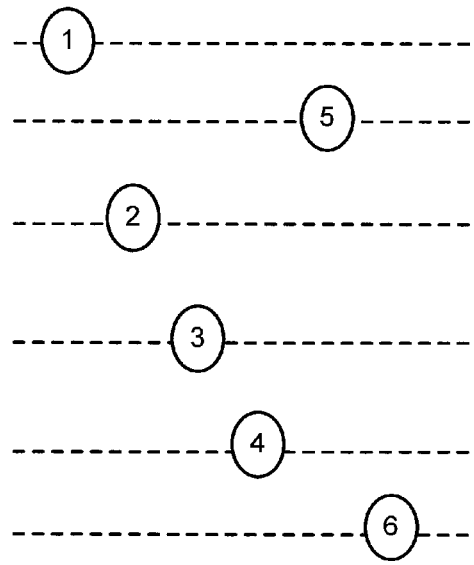 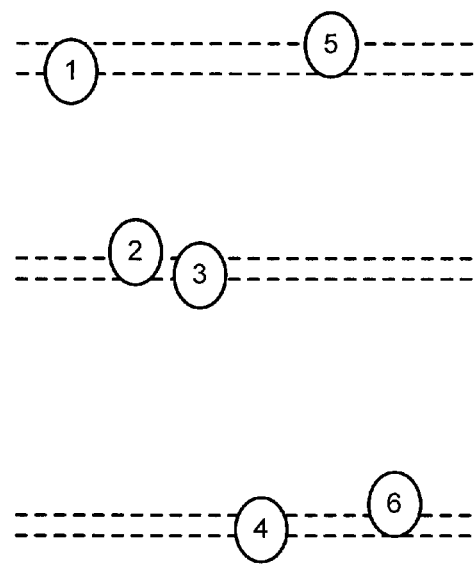
FIG. 11    FIG. 12
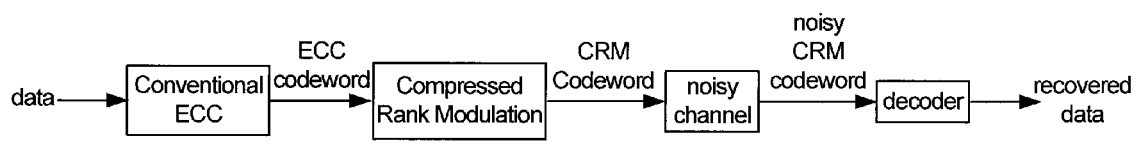
FIG. 13

FLASH MEMORIES USING MINIMUM PUSH UP, MULTI-CELL AND MULTI-PERMUTATION SCHEMES FOR DATA STORAGE

CROSS-REFERENCES TO RELATED APPLICATIONS

This application claims the benefit of U.S. Provisional Application Ser. No. 61/608,245 entitled "Compressed Encoding for Rank Modulation" by Anxiao Jiang, Eyal En Gad and Jehoshua Bruck filed Mar. 8, 2012 and claims the benefit of U.S. Provisional Application Ser. No. 61/608,465 entitled "Multi-Cell memories and compressed Rank Modulation" by Anxiao Jiang, Eyal En Gad, and Jehoshua Bruck filed Mar. 8, 2012. Priority of the filing dates is hereby claimed, and the disclosures of the prior applications are hereby incorporated by reference for all purposes.

FEDERAL FUNDING STATEMENT

This invention was made with government support under ECCS0802107 and CCF0747415 awarded by the National Science Foundation. The government has certain rights in the invention.

BACKGROUND

The present disclosure generally relates to data storage devices, systems and methods. In various examples, data modulation techniques in data storage devices such as flash memory devices are described.

Flash memories are one type of electronic non-volatile memories (NVMs), accounting for nearly 90% of the present NVM market. See, for example, the Web site of Saifun Semiconductors Ltd. (available at www.saifun.com) and Web-Feet Research, Inc. (available at www.web-feetresearch.com). Today, billions of flash memories are used in mobile, embedded, and mass-storage systems, mainly because of their high performance and physical durability. See, for example, P. Cappelletti et al., Chapter 5, "Memory Architecture and Related Issues" in *Flash memories*, Kluwer Academic Publishers, 1st Edition, 1999), and E. Gal and S. Toledo, *ACM Computing Surveys*, 37(2):138-163 (2005). Example applications of flash memories include cell phones, digital cameras, USB flash drives, computers, sensors, and many more. Flash memories are now sometimes used to replace magnetic disks as hard disks, such as the 64 GB hard disk by SanDisk (see "SanDisk launches 64 gigabyte solid state drives for notebook PCs, meeting needs for higher capacity," available at the Web site URL of http://biz.yahoo.com/cnw/070604/sandisk.html?.v=1). See also the Web article on the 256 GB hard disk by PQI ("PQI unveils 256 GB solid state drive," available at the URL of www.guru3d.com/newsitem.php?id=5392). Based on the popular floating-gate technology, the dominance of flash memories is likely to continue.

Some problems exist that may limit the improvement of flash memories with respect to their speed, reliability, longevity, and storage capacity. Flash memories may have a limited lifetime due to the quality degradation caused by block erasures; a flash memory can endure only about $10^5 \sim 10^6$ block erasures before it becomes no longer usable (see S. Aritome et al., *Proceedings of the IEEE*, 81(5):776-788 (1993), and P. Cappelletti et al., ibid. Removing charge from any single cell for data modification may require the block to be erased and all the $10^5$ or so cells in it to be reprogrammed (or programmed to another block). The writing speed may be constrained by a conservative cell-programming process that is about ten times slower than reading. One purpose of such conservative programming is to avoid over-programming, a serious error that may only be correctable by block erasure and reprogramming. Data reliability may be limited by errors caused by charge leakage, disturbs, and the like. See S. Aritome et al., ibid; P. Cappelletti et al., ibid; and P. Pavan et al., *Proceedings of The IEEE*, 85(8):1248-1271 (August 1997). The errors become more common when multi-level cells are used to increase the storage capacity.

SUMMARY

In some examples, a minimum push-up scheme to store data in flash memories is described. In some embodiments, the minimum push-up scheme starts with data values $v=[v_1, v_2, \ldots, v_n] \in S_n$ that are received to be stored in data storage containing current values $u=[u_1, u_2, \ldots, u_n] \in S_n$. Next, v is defined as an element of S where S is defined as a set of symbols in a rank modulation coding scheme. Further, n is defined as a number of ranks in v to be stored in a group of n rank locations in data storage of the data device. The group of n rank locations are programmed according to the rank modulation coding scheme and the value v such that for $i=n-1, n-2, \ldots, 1$ the programmed value of a rank location $v_i$ is increased until it is greater than the value of a rank location $v_{i+1}$ by a minimum cell differentiation amount.

In some embodiments each of the n rank locations may comprise a cell of the device data storage. In further embodiments, each rank location may comprise a plurality of cells of the device data storage. In other embodiments, each rank location may comprise an equal number of cells of the device data storage. In still further embodiments, programming may comprise increasing the value of all cells in the rank location $v_i$ until the value in each of the cells $v_i$ is greater than the value in each of the cells in the rank location $v_{i+1}$. In other embodiments, the current values of $u=[u_1, u_2, \ldots, u_n] \in S_n$ are read from the device data storage before the programming of the group of n rank locations with v.

In another aspect, a new scheme, multi-cells, used for storing data in flash memories is provided. NAND flash memory is the most widely used type for general storage purpose. In NAND flash, several floating gate transistors are connected in series where we can read or write only one of them at a time. Each transistor is replaced with a multi-cell of m transistors connected in parallel. The control gates, the sources and the drains of the transistors are connected together. That way, their current sums together in read operations, and the read precision increases by m times, allowing the storages of mq levels in a single multi-cell. In write operations, the same value is written to all the transistors, such that the sum of their charge levels provides the desired total level.

In some embodiments processes for manufacturing and operating a data device are provided. A plurality of transistors, each of which is capable of storing charge, are disposed on a device. Each of the plurality of transistors comprises a gate, a source, and a drain. Connections are formed between the sources, gates and drains of each of the plurality of transistors. Each connection is capable of carrying electrical current. Next, data is stored in the plurality of transistors. The data corresponds to a sum of charges stored in each of the plurality of transistors. In further embodiments connections may be formed between the gates of each of the plurality of transistors.

In yet further embodiments, a process for operating a data device is provided. First, a code word is generated that has a plurality of symbols selected from a set of symbols. Each of the plurality of symbols is stored in a data storage location of the data device. Each data storage location comprises a plurality of parallel connected devices. In some embodiments the plurality of parallel connected devices may comprise transistors.

In yet another aspect, multi-permutations, used for storing data in flash memories is provided. The paradigm of representing information with permutations is generalized to the case where the number of cells in each level is a constant greater than 1, multi-permutations.

Namely, the states that the cells can take are no longer permutations of a set, but permutations of a multiset. For example, if the number of cells at each level is $2_2$, the two cells in each level do not need to be identical in their analog values, they just need to be distinguishable with other levels (but do not need to be mutually distinguishable). Hence, the encoding and decoding use relative levels, and the scheme has good resistance to drift; namely, the advantages of the permutation based relative scheme that we described above still apply. The case where the multiplicities of all the elements in the multiset are equal, is denoted by z. This generalization becomes interesting especially when z is large, and n is still much larger than z. In that case (if q is still much larger than n), it can be proven that the upper bound on the total capacity is 2q bits per cell, and that there exists a construction that approaches this bound. The instantaneous capacity of the construction is approaching 2 bits per cell.

In some embodiments, a computer method of operating a data device where a predetermined rank configuration $(d_1, d_2 \ldots d_n)$ is defined. Further, $d_i$ is the number of cells in the $i^{th}$ rank. A new multi-permutation is received and defined by $v=[v_1, v_2, \ldots, v_n] \in S$ that fits the predetermined rank configuration. A process is then initiated in response to receiving the new multi-permutation, adding charge to each cell in a plurality of memory locations such that the plurality of cells represent the new multi-permutation. The process may be continued.

In other embodiments, the sequential order of an initial analog level of a stored value in each cell of a plurality of cells in a data device is determined. The sequential order is defined as a value x comprising $$[\{x_1, x_2, \ldots, x_{d_1}\}, \{x_{d_1+1}, x_{d_1+2}, \ldots, x_{d_1+d_2}\}, \ldots, \{x_{1+\Sigma_{i=1}^{n-1} d_i}, x_{2+\Sigma_{i=1}^{n-1} d_i}, \ldots, x_{\Sigma_{i=1}^{n} d_i}\}].$$

In further embodiments, a predetermined rank configuration $(d_1, d_2 \ldots d_n)$ is defined, wherein $d_i$ is the number of cells in the $i^{th}$ rank. A new multi-permutation is received and defined by $v=[v_1, v_2, \ldots, v_n] \in S$ that fits the predetermined rank configuration. The analog levels of cells of a rank n in v are retained. Finally, the cells of rank i in v for I=n−1, n−2 . . . , 1 such that the analog levels of cells in a rank i are programmed to all be higher than the analog levels of the cells of rank i+1 in v by at least a minimum rank differentiation. The process may be continued.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 7A is a schematic diagram of a traditional arrangement of a NAND flash memory structure accordance with the description herein.

FIG. 7B is a schematic diagram of a multi-cell arrangement of a NAND flash memory structure accordance with the description herein.

FIG. 11 is a representation of a memory cell arrangement in accordance with the description herein.

FIG. 12 is a representation of a memory cell arrangement in accordance with the description herein.

FIG. 13 is a representation of system model for compressed rank modulation in accordance with the description herein.

DETAILED DESCRIPTION

Figure 1:
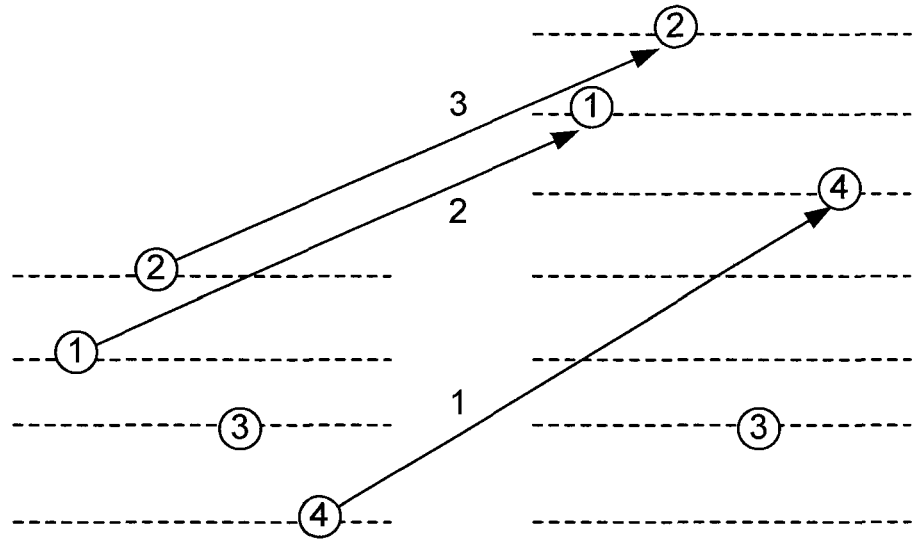
FIG. 1 is a representation of a memory cell arrangement using "push to the top" operations in accordance with the description herein.

The contents of this Detailed Description are organized under the following major headings:
  I. Introduction to Rank Modulation
  II. Permutation "Minimum Push Up"
    A. Rewrite Model and the Transition Graph
    B. Worst-case Decoding Scheme for Rewrite
  III. Multi-Cells
    A. Multi-Cell Flash Memory
    B. Notations and Model Properties
    C. Upper Bounds
    D. Construction for the Average Case
    E. Existence for the Worst Case IV. Multi-Permutations
   A. Compressed Rank Modulation
      1. Initial Write
      2. Subsequent Rewrites
      3. Programming Symmetric Cells
      4. Rebalancing Permutations
      5. Record Weights
V. Example Embodiments
VI. Conclusion Subheadings in the description are not listed above but may be present in the description below.

I. INTRODUCTION TO RANK MODULATION

The amount of charge stored in a flash memory cell can be quantized into $q \geq 2$ discrete values in order to represent up to $\log_2 q$ bits. (The cell is called a single-level cell (SLC) if $q=2$, and called a multi-level cell (MLC) if $q>2$). The q states of a cell are referred to as its levels: level 0, level 1, ..., level q−1. The charge is quantized into discrete levels by an appropriate set of threshold levels. The level of a cell can be increased by injecting charge into the cell, and decreased by removing charge from the cell. Flash memories have a property that although it is relatively easy to increase a cell's level, it is very costly to decrease it. This results from the structure of flash memory cells, which are organized in blocks of about $10^5 \sim 10^6$ cells. In order to decrease any cell's level, its entire containing block is erased first (which involves removal of the charge from all the cells of the block) and after then it can be reprogrammed. Block erasures are not only slow and energy consuming, but also significantly reduce the longevity of flash memories, because every block can endure only about $10^4 \sim 10^5$ erasures with guaranteed quality. See, for example, P. Cappelletti, C. Golla, P. Olivo, and E. Zanoni, *Flash Memories*. Kluwer Academic Publishers, 1999. Therefore, reducing the number of block erasures improves the longevity of flash memories.

In MLC flash memory, the process of programming a cell to a specific level is designed carefully. The target level is approached from below in order to avoid overshooting of the cell, which may result in an undesirable block erasure. Consequently, these attempts use multiple programming cycles, and they work only up to a moderate number of levels per cell, e.g. 8 or 16 levels. In order to avoid the problem of exact programming of a cell level, a framework of the rank modulation coding was introduced. See, for example, A. Jiang, R. Mateescu, M. Schwartz, and J. Bruck, *Rank modulation for flash memories, IEEE Trans. on Inform. Theory*, vol. 55, no. 6, pp. 2659-2673, June 2009, hereinafter Rank Modulation for flash memories. The main idea of this coding scheme is to represent the information by the relative values of the cell levels rather than by their absolute values. Given a set of N cells, their levels induce a permutation which is used to encode the data. One of the features of the rank modulation scheme is that in programming, a cell is charged to a higher level than that of the previous cell in the permutation, and therefore there is reduced risk of overshooting. Another feature of representing data by the ranking of the cells, is that the threshold levels are no longer needed. This mitigates the effects of retention in the cells (slow charge leakage).

Rank Modulation for flash memories described rewriting codes for the rank modulation scheme, in order to reuse the memory between block erasures. In general, a motivation behind rewriting codes for flash memories is to increase the number of times data can be rewritten between two erasure operations while preserving the constraint that cells only increase their level.

In rank modulation, a feature is to minimize the increase in the highest charge level among the cells after a rewriting operation. An observation is that rewriting of different permutations may increase the highest charge level of the cells by different magnitudes. For example, assume the current permutation be (3,1,2), such that the first cell has the highest level, e.g. its rank is 3, then the third cell (rank 2) and finally the second cell (rank 1). Now assume the cells are rewritten and are to represent the permutation (2,3,1). This can be done by adding sufficient charge to cell 2 such that its level is greater than the first cell's level. Now consider a different case, where the cells need to represent the permutation (1,2,3). In this case, the level of both cell 2 and cell 3 are raised to be higher than the level of cell 1, as shown in FIG. 1. Since some gap may be needed between them, and also some gap between cell 2 and cell 1, it is possible that the increase in the level of the highest cell in the second example, may be twice as much as the increase in the first example.

A consequence from the previous operation(s) is, that if every permutation represents different information, then the number of rewrites before incurring a block erasure can vary between different input data sequences. In order to obtain a large number of rewrites, rewriting codes let multiple permutations represent the same information (that is, introducing redundancy). Thus, when a certain data is to be written, there would be at least one permutation corresponding to that data that could be written without increasing the charge of the highest cell by a large amount. In Rank Modulation for flash memories, rewriting codes were studied under a strong constraint of push-to-the-top operations. In every push-to-the-top operation, a single cell is set to be the top-charged cell. This scheme provides easy implementation and fast programing, but it suffers a relatively low rate.

The work on rank modulation coding for flash memories paved the way for additional results in this area. First, error-correcting codes in the rank modulation setup attracted a lot of attention. See, for example, A. Barg and A. Mazumdar, "Codes in permutations and error correction for rank modulation," *IEEE Trans. on Inform. Theory*, vol. 56, no. 7, pp. 3158-3165, July 2010; F. Farnoud, V. Skachek, and O. Milenkovic, "Rank modulation for translocation correction," in *Proceedings of the IEEE International Symposiom on Information Theory Workshop (ISIT)*, June 2012, pp. 2988-2992; A. Jiang, M. Schwartz, and J. Bruck, "Correcting charge-constrained errors in the rank-modulation scheme," *IEEE Trans. on Inform. Theory*, vol. 56, no. 5, pp. 2112-2120, May 2010; I. Tamo and M. Schwartz, "Correcting limited-magnitude errors in the rank-modulation scheme," *IEEE Trans. on Inform. Theory*, vol. 56, no. 6, pp. 2551-2560, June 2010. Other variations of rank modulation were studied as well. A new concept of bounded/local rank modulation was introduced and its capacity was calculated. See, for example, Z. Wang, A. Jiang, and J. Bruck, "On the capacity of bounded rank modulation for flash memories," in *Proc. 2009 IEEE Int. Symp. Information Theory*, June 2009, pp. 1234-1238. Here, the data is not represented by a single permutation, but rather, a sequence of permutations of a given size, which may overlap, are used to represent the data. Yet another variation, called partial rank modulation, was introduced. See, for example, Z. Wang and J. Bruck, "Partial rank modulation for flash memories," in *Proceedings of the 2010 IEEE International Symposium on Information Theory (ISIT2010)*, Austin, Tex., U.S.A., June 2010, pp. 864-868. Now the data is represented by a single permutation, but only the highest k cell levels, for some fixed k, may be considered for the information representation.

II. PERMUTATION "MINIMUM PUSH UP"

The cost of changing the state in the scheme—namely, the cost of the rewriting step—is measured by the number of "push-to-top" operations that are used, because it represents by how much the maximum cell level among the n cells has increased. See, for example, A. Jiang, R. Mateescu, M. Schwartz, and J. Bruck, "Rank modulation for flash memories," *IEEE Trans. on Inform. Theory*, vol. 55, no. 6, pp. 2659-2673, June 2009. Reducing this cell-level increment may be performed in one embodiment because the cells have a physical limit that upper bounds the cell levels. The less the cell levels are increased, the more rewrites can be performed before a block erasure operation is used, and the longer the lifetime of the memory will be.

An example is shown in FIG. 1, where the state of n=4 cells is to be changed from u=[2,1,3,4] to v=[2,1,4,3]. (Here the cells are indexed by 1, 2, ..., n. And their state is denoted by the permutation $[u_1, u_2, \ldots, u_n] \in S_n$, where cell $u_1$ has the highest charge level and $u_n$ has the lowest charge level. For i=1, ..., n, cell $u_i$ has rank i.) Three "push-to-top" operations are used, where cell 4, cell 1 and cell 2 are pushed sequentially. They are represented by the three edges in FIG. 1. The cost of this rewriting is 3.

Figure 2:
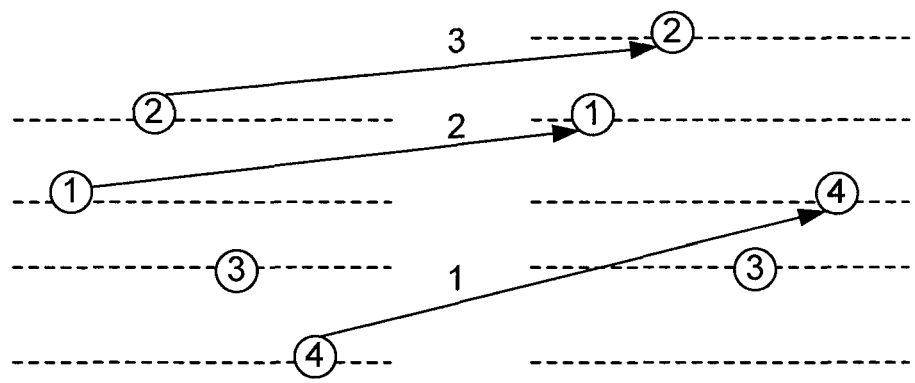
FIG. 2 is a representation of a memory cell arrangement using "minimal push up" operations in accordance with the description herein.

It can be seen from the above example, however, that the "push-to-top" operation is a conservative approach. To change the state from u=[2,1,3,4] to v=[2,1,4,3], when cell 4 is pushed, the level of cell 4 is pushed to be greater than cell 3. There is no need to make the level of cell 4 to be greater than the levels of all the other n−1=3 cells (i.e., cells 1, 2 and 3). Similarly, when cell 1 is pushed, its level is pushed to be greater than cell 3 and cell 4, instead of cells 2, 3 and 4. So a more moderate programming approach as shown in FIG. 2 can be taken, and the increment of the cell levels (in particular, the increment of the maximum cell level) can be substantially reduced. So, the cost of rewriting can be reduced, which improves the overall rewriting performance and the longevity of the memories.

Figure 6:
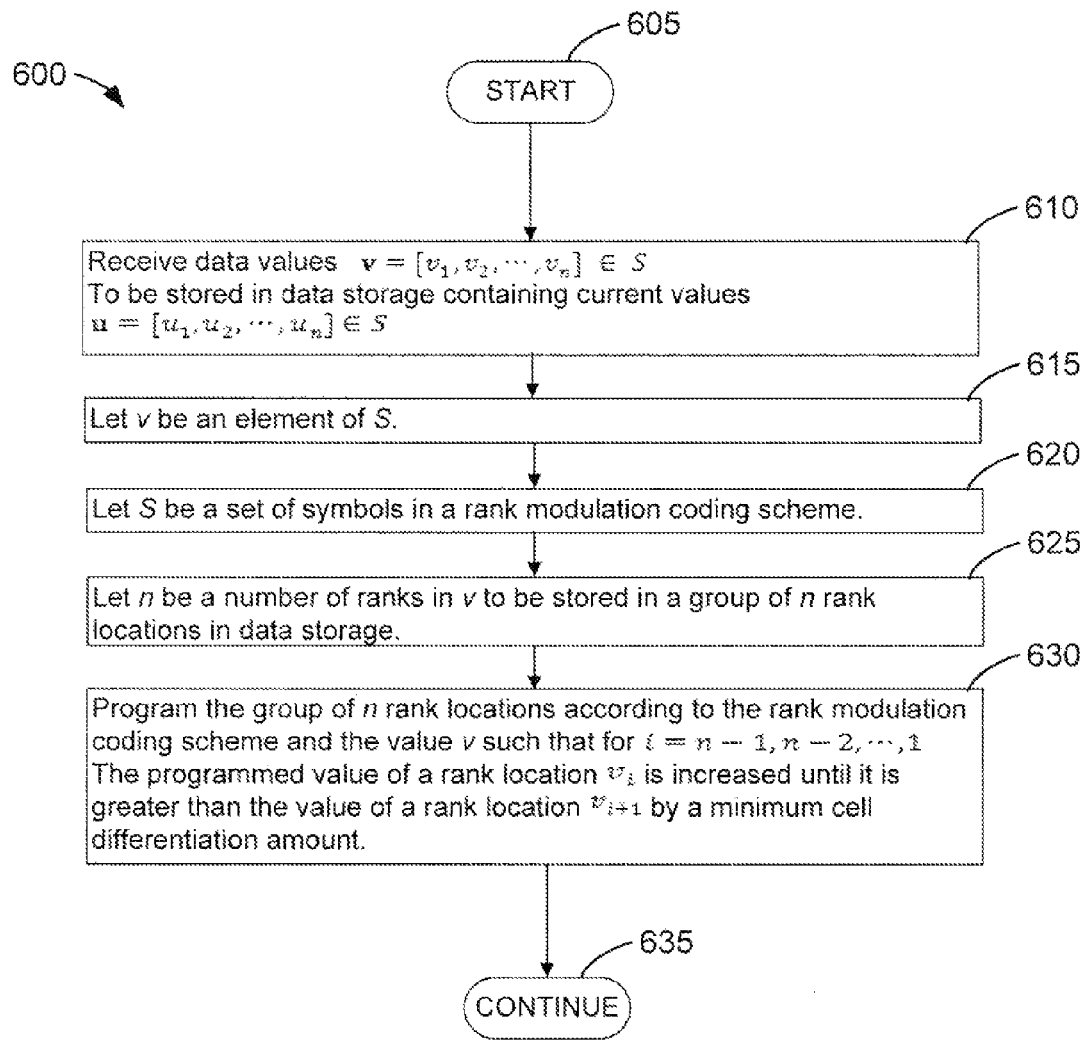
FIG. 6 is a process that depicts a programming approach that minimizes the increase of cell levels in accordance with the description herein.

Described in this disclosure is a programming approach that minimizes or otherwise reduces the increase of cell levels as illustrated in FIG. 6. To change the cell state from $u=[u_1, u_2, \ldots, u_n] \in S_n$ to $v=[v_1, v_2, \ldots, v_n] \in S_n$, the cells are programed based on their order in v, so that every cell's level increases as little as possible:

For i=n−1, n−2, ..., 1 perform:
  {Increase the level of cell $v_i$, to make it greater than the level of the cell $v_{i+1}$}.

Note that in the above programming process, when cell $v_i$ is programmed, cell $v_{i+1}$ already has the highest level among the cells $v_{i+1}, v_{i+2}, \ldots, v_n$. The programming operation here is referred to as the "minimal-push-up" operation. (In comparison, if cell $v_i$ is programmed to make its level greater than the maximum level among the cells $v_1, \ldots, v_{i-1}, v_{i+1}, \ldots, v_n$, then it becomes the original "push-to-top" operation.) The "minimal-push-up" approach is robust, as it has reduced risk of overshooting. And it reduces increment of the maximum level of the n cells (e.g., the rewrite cost).

A. Rewrite Model and the Transition Graph

For coding schemes, a good robust discrete model is used for the rewriting. A discrete model is described herein for measuring the rewriting cost, which is suitable for both the "push-to-top" approach and the "minimal-push-up" approach. To rigorously describe the cost of a rewrite operation (i.e., a state transition), the concept of virtual levels is used. Let $u=[u_1, u_2, \ldots, u_n] \in S_n$ denote the current cell state, and let $v=[v_1, v_2, \ldots, v_n] \in S_n$ denote the new state that the cells change into via increasing cell levels. Let $d(u \rightarrow v)$ denote the number of push-up operations that are applied to the cells in order to change the state from u into v. For i=1, 2, ..., d(u→v), let $p_i \in [n] \triangleq \{1, 2, \ldots, n\}$ denote the integer and let $B_i \subseteq [n] \setminus \{p_i\}$ denote the subset, such that the i-th push-up operation is to increase the $p_i$-th cell's level to make it greater than the levels of all the cells in $B_i$. (For example, for the rewriting in FIG. 1, we have d(u→v)=3, $p_1$=4, $B_1$={1,2,3}, $p_2$=1, $B_2$={2,3,4}, $p_3$=2, $B_3$={1,3,4}. And for the rewriting in FIG. 2, we have d(u→v)=3, $p_1$=4, $B_1$={3}, $p_2$=1, $B_2$={3,4}, $p_3$=2, $B_2$={1,3,4}.) Such push-up operations have reduced risk of overshooting.

For the current state u, we assign the virtual levels n, n−1, ..., 2, 1 to the cells $u_1, u_2, \ldots, u_{n-1}, u_n$, respectively. The greater a cell's level is, the greater its virtual level is. It is noted that when the virtual level increases by one, the increase in the actual cell level is not a constant because it depends on the actual programming process, which is noisy. However, when a cell a is programmed to make its level higher than a cell b, the difference between the two cell levels will concentrate around an expected value. (For example, a one-shot programming using hot-electron injection can achieve stable programming performance at high writing speed.) Based on this, a discrete model for rewriting is provided, which may be a usable tool for designing coding schemes.

Consider the ith push-up operation (for i=1, ..., d(u→v)), where the level of cell $p_i$ is increased to make it greater than the levels of the cells in $B_i$. For any $j \in [n]$, let $l_j$ denote cell j's virtual level before this push-up operation. Then after the push-up operation, the virtual level of cell $p_i$ may be $$1 + \max_{j \in B_i} \ell_j;$$

namely, it is greater than the maximum virtual level of the cells in $B_i$ by one. This increase represents the increment of the level of cell $p_i$. After the d(u→v) push-up operations that change the state from u to v, for i=1, ..., n, let $l_i^1$ denote the virtual level of cell i. The cost of the rewriting process is described as the increase in the maximum virtual level of the n cells, which is $$\max_{i \in [n]} \ell_i' - n = \ell_{v_1}' - n.$$

Example 1

For the rewriting process shown in FIG. 1, the virtual levels of cells 1, 2, 3, 4 change as (3,4,2,1)→(3,4,2,5)→(6,4,2,5)→(6,7,2,5). Its cost is 3.

For the rewriting process shown in FIG. 2, the virtual levels of cells 1, 2, 3, 4 change as (3,4,2,1)→(3,4,2,3)→(4,4,2,3)→(4,5,2,3). Its cost is 1.

Figure 3:
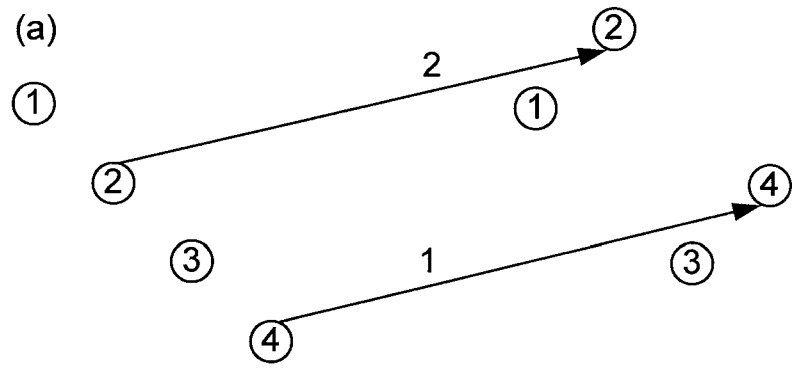
FIG. 3 is a representation of a memory cell arrangement using typical "minimal push up" operations in accordance with the description herein.
Figure 4:
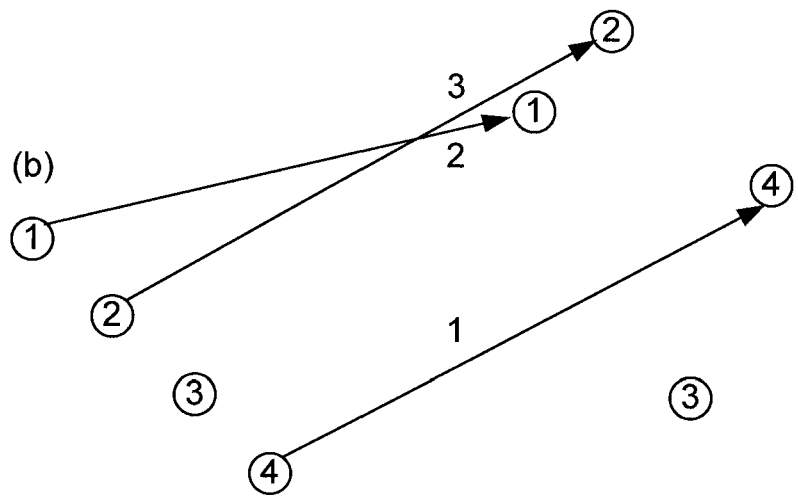
FIG. 4 is a representation of a memory cell arrangement depicting a rare case of "minimal push up" operations in accordance with the description herein.

The model captures the typical behavior of cell programming. Yet when the minimal-push-up operations are used, the number of cells to push may not always be a constant when the old and new states u, v are given. An example is shown in FIGS. 3 and 4, where the state changes from u=[1,2,3,4] to v=[2,1,4,3]. An example programming process is shown in FIG. 3, where two cells—cell 4 and then cell 2—are pushed up sequentially. (Note that based on the discrete model, the rewriting cost is 1. This is consistent with the increase of the maximum cell level here.) But as shown in FIG. 4, in the rare case where cell 4's level is significantly over-raised to the extent that it exceeds the level of cell 1, cell 1 will also be programmed, leading to three minimal-push-up operations in total. However, we would like to show that above discrete model is still a robust model for the following reasons. First, in this paper we focus on the typical (i.e., most probable) behavior of cell programming, where the rewriting cost matches the actual increase of the maximum cell level well. In the rare case where cell levels are increased by too much, additional load balancing techniques over multiple cell groups can be used to handle it. Second, the rare case—that a cell's level is overly increased—can happen not only with the minimal-push-up operation but also with the push-to-top operation; and its effect on the increment of the maximal cell level is similar for the two approaches. So the discrete model still provides a fair and robust way to evaluate the rewriting cost of different state transitions.

Figure 5:
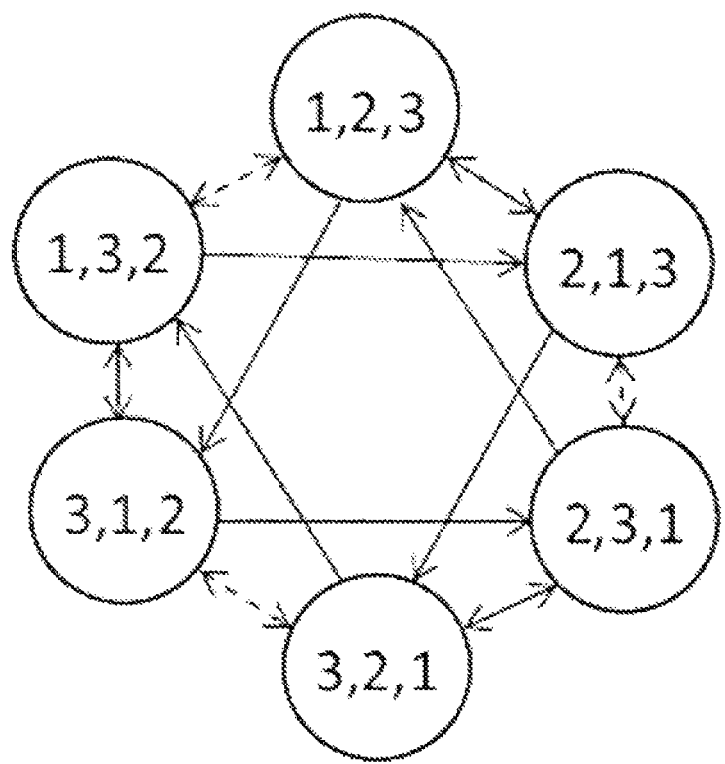
FIG. 5 is a state diagram for the states of three cells in accordance with the description herein.

This disclosure describes codes based on state transitions using the minimal-push-up operations. Given two states $u=[u(1), u(2), \ldots, u(n)] \in S_n$ and $v=[v(1), v(2), \ldots, v(n)] \in S_n$, let $C(u \to v)$ denote the cost of changing the state from u to v. (Note that $u(\bullet)$, $v(\bullet)$ are both functions. Let $u^{-1}$, $v^{-1}$ be their inverse functions.) The value of $C(u \to v)$ can be computed as follows. Corresponding to the old state u, assign virtual levels $n, n-1, \ldots, 1$ to the cells $u(1), u(2), \ldots, u(n)$, respectively. For $i=1, 2, \ldots, n$, let $l_i$ denote the virtual level of cell i corresponding to the new state v. Then based on the programming process described previously, $l_1, \ldots, l_n$ can be computed as follows:

1. For $i=1, 2, \ldots, n$ perform:
   $\{l_{u(i)} \leftarrow n+1-i.\}$
2. For $i=n-1, n-2, \ldots, 1$ do:
   $\{l_{v(i)} \leftarrow \max\{l_{v(i+1)}+1, l_{v(i)}\}.\}$ Then:
$C(u \to v) = l_{v(1)} - n.$ It can be seen that $0 \le C(u \to v) \le n-1$. An example of the rewriting cost is shown in FIG. 5.

The following theorem provides an equivalent definition of the cost. According to the theorem, the cost is equal to the maximal increase in rank among the cells.

$$C(u \to v) = \max_{i \in [n]}(v^{-1}(i) - u^{-1}(i)) .. \qquad \text{Theorem 1}$$

Proof:

Assume by induction on k that $$\ell_{v(k)} = n + 1 - k + \max_{i \in [k, \ldots, n]}(i - u^{-1}(v(i))).$$

In the base case, $k=n$, and $l_{v(n)} = n+1-n+\max_{i \in [n, \ldots, n]}(i-u^{-1}(v(i))) = 1+n-u^{-1}(v(n))$. This is the result of the programming process. Now assume that the expression is true for k. For $k-1$, by the programming process, $$\ell_{v(k-1)} = \max\{\ell_{v(k)} + 1, n + 1 - u^{-1}(v(k-1))\}$$

$$= \max\begin{cases} n + 1 - k + \max_{i \in [k, \ldots, n]}(i - u^{-1}(v(i))) + 1, \\ n + 1 - u^{-1}(v(k-1)) \end{cases}$$

by the induction assumption $$= n + 1 - (k-1) + \max\left\{\max_{i \in [k, \ldots, n]}(i - u^{-1}(v(i))), k - 1 - u^{-1}(v(k-1))\right\} =$$

$$n + 1 - (k-1) + \max_{i \in [k-1, \ldots, n]}(i - u^{-1}(v(i)))$$

and the induction is proven.

Now $l_{v(1)}$ is assigned in the definition of the cost:

$$C(u \to v) = \ell_{v(1)} - n$$

$$= n + 1 - 1 + \max_{i \in [1, \ldots, n]}(i - u^{-1}(v(i))) - n$$

$$= \max_{i \in [n]}(v^{-1}(i) - u^{-1}(i))$$

Codes for rewriting data based on the "push-to-top" operation have been studied. See, for example, A. Jiang, R. Mateescu, M. Schwartz, and J. Bruck, "Rank modulation for flash memories," *IEEE Trans. on Inform. Theory*, vol. 55, no. 6, pp. 2659-2673, June 2009. Since the "minimal-push-up" approach has lower rewriting cost than the "push-to-top" operation, rewrite codes can be constructed with higher rates.

In order to discuss rewriting, a decoding scheme is defined. It is often the case that the alphabet size used by the user to input data and read stored information differs from the alphabet size used as internal representation. In one embodiment, data is stored internally in one of n! different permutations. Assume the user alphabet is $Q=\{1, 2, \ldots, q\}$. A decoding scheme is a function $D: S_n \to Q$ mapping internal states to symbols from the user alphabet. Suppose the current internal state is $u \in S_n$ and the user inputs a new symbol $a \in Q$. A rewriting operation given a is now defined as moving from state $u \in S_n$ to state $v \in S_n$ such that $D(v)=a$. The cost of the rewriting operation is $C(u \to v)$.

Next, the transition graph $G_n = (V_n, A_n)$ is defined as a directed graph with $V_n = S_n$, i.e., with n! vertices representing the permutations in $S_n$. There is a directed edge $u \to v$ if and only if $C(u \to v)=1$. Note that $G_n$ is a regular digraph. Given a vertex $u \in V_n$ and an integer $r \in \{0, 1, \ldots, n-1\}$, the ball $B_{n,r}(u)$ is defined as $B_{n,r}(u) = \{v \in V_n | C(u \to v) \le r\}$.

$$|B_{n,r}(u)| = r!(r+1)^{n-r} \qquad \text{Theorem 2.}$$

Proof:

Induction is used on n. When $n=2$ the statement is trivial. (So is it when $n=r+1$, where $|B_{r+1,r}(u)| = (r+1)!$) Now the statement is assumed to be true for $n \le n_0$, and consider $n=n_0+1$ and $n > r+1$. Let $u=[u(1), u(2), \ldots, u(n)] \in S_n$, and without loss of generality (w.l.o.g.) let $u(1)=n$. Let $v=[v(1), v(2), \ldots, v(n)] \in B_{n,r}(u)$. Let $\hat{u}=[u(2), u(3), \ldots, u(n)] \in S_{n-1}$, and let $\hat{v} \in S_{n-1}$ be obtained from v by removing the element $u(1)=n$. By Theorem 1, the first element in u, namely $u(1)=n$, can take one of the first r+1 positions in v. Given that position, there is a one-to-one mapping between pushing-up the remaining n−1 elements from u to $v \in S_n$ and pushing-up those n−1 elements from $\hat{u}$ to $\hat{v} \in S_{n-1}$, and $C(\hat{u} \to \hat{v}) = C(u \to v)r$. So the following results: $|B_{n,r}(u)| = (r+1)|B_{n-1,r}(\hat{u})| = \ldots = (r+1)^{n-r-1} \cdot (r+1)! = r!(r+1)^{n-r}$.

Note that given u, $|\{v \in S_n | |v^{-1}(i) - u^{-1}(i)| \le r \text{ for } 1 \le i \le n\}|$ is the size of the ball under infinity norm. When $r=1$, that size is known to be a Fibonacci number. See, for example, T. Kløve, "Spheres of permutations under the infinity norm—permutations with limited displacement," University of Bergen, Bergen, Norway, Tech. Rep. 376, November 2008.

In addition, we note that $|B_{n,1}(u)| = 2^{n-1}$. Therefore, the out-degree of each vertex in $G_n$ is $2^{n-1} - 1$. In comparison, when we allow only the "push-to-the-top" operation, $|B_{n,1}(u)|=n$. Hence we get an exponential increase in the degree, which might lead to an exponential increase in the rate of rewrite codes. In the next section we study rewrite codes under a worst-case cost constraint.

B. Worst-Case Decoding Scheme for Rewrite

Described herein are codes where the cost of the rewrite operation is limited by r.

1. The case of $n \leq 4$

The case of $r=1$ is evaluated first. The first non-trivial case for $r=1$ is $n=3$. However, for this case the additional "minimal-push-up" transitions do not allow for a better rewrite code. An optimal construction for a graph with only the "push-to-top" transitions has been discussed. See, for example, A. Jiang, R. Mateescu, M. Schwartz, and J. Bruck, "Rank modulation for flash memories," *IEEE Trans. on Inform. Theory*, vol. 55, no. 6, pp. 2659-2673, June 2009. That construction assigns a symbol to each state according to the first element in the permutation, for a total of 3 symbols. This construction may also be optimal for a graph with the "minimal-push-up" transitions.

For greater values of n, in order to simplify the construction, we limit ourselves to codes that assign a symbol to each of the n! states. We call such codes full assignment codes. Note that better codes for which not all the states are assigned to symbols might exist. When all of the states are assigned to symbols, each state must have an edge in $A_n$ to at least one state labeled by each other symbol. We define a set of vertices D in $G_n$ as a dominating set if any vertex not in D is the initial vertex of an edge that ends in a vertex in D. Every denominating set is assigned to one symbol. Our goal is to partition the set of n! vertices into the maximum number of dominating sets. We start by presenting a construction for $n=4$.

Construction 1.

Divide the 24 states of $S_4$ into 6 sets of 4 states each, where each set is a coset of $\langle(1,2,3,4)\rangle$, the cyclic group generated by $(1,2,3,4)$. Here $(1,2,3,4)$ is the permutation in the cycle notation, and $\langle(1,2,3,4)\rangle=\{[1,2,3,4],[2,3,4,1],[3,4,1,2],[4,1,2,3]\}$. Map each set to a different symbol.

Theorem 3.

Each set in Construction 1 is a dominating set.

Proof:

Let $I_d$ be the identity permutation, $g=(1,2,3,4)$ and $G=\langle g\rangle$. For each $h \in S_4$, hG is a coset of G. For each $v=[v(1), \ldots, v(n)] \in hG$ and each $u=[u(1), \ldots, u(n)] \in S_4$ such that $u(1)=v(1)$, u has an edge to either v or $v*g$. For example, in the coset $I_d G=G$, for $v=I_d$ and $u \in S_n$ such that $u(1)=v(1)=1$, if $u(2)$ is 2 or 3, u has an edge to $I_d=[1,2,3,4]$, and if $u(2)=4$, u has an edge to $I_d*g=[4,1,2,3]$. Since G is a cyclic group of order 4, for every $u \in S_4$ there exists $v \in hG$ such that $u(1)=v(1)$, and therefore hG is a dominating set.

For k [n] and $B \subseteq S_n$, define:

$$Pref_k(B)=\{t | s=tu \text{ for } |u|=k \text{ and } s \in B\}$$

where t, u are segments of the permutation s. For example, $Pref_3(\{[1,2,3,4,5],[1,2,3,5,4],[1,3,2,4,5]\})=\{[1,2],[1,3]\}$.

A lower bound is provided to a dominating set's size.

Theorem 4.

If D is a dominating set of $G_n$, then $$|D| \geq \frac{n!}{\frac{3}{4} \cdot 2^{n-1}}.$$

Proof:

Each $p_3 \in Pref_3(S_n)$ is a prefix of 3 different prefixes in $Pref_2(S_n)$. For example, for $n=5$, [1,2] is a prefix of $\{[1,2,3],[1,2,4],[1,2,5]\}$. Each v D dominates $2^{n-2}$ prefixes in $Pref_2(S_n)$. For example, for $n=4$, every permutation that start with [1,2], [1,3], [2,1] or [2,3] has an edge to [1,2,3,4]. This set of prefixes can be partitioned into sets of two members, each sharing the same prefix in $Pref_3(S_n)$. For one such set $B_2=\{p_{2,1}, p_{2,2}\}$, and $p_3$ denotes the only member of $Pref_3(B_2)$. Since D is a dominating set, all of the members of $Pref_2(S_n)$ are dominated. Therefore, the third prefix $p_{2,3} \notin B_2$ such that $\{p_3\}=Pref_3(\{B_2, p_{2,3}\})$ is dominated by some $u \in D$, $u \neq v$. Moreover, u dominates also one of the prefixes in $B_2$. Therefore, at least half of the prefixes in $Pref_2(S_n)$ that v dominates are also dominated by at least one other member of D. $X_v$ denotes the set of prefixes in $Pref_2(S_n)$ that are dominated by v and not by any $u \neq v$ such that $u \in D$, and $Y_v$ denotes the prefixes in $Pref_2(S_n)$ that are also dominated by at least one such $u \neq v$. Also defined is $X=\Sigma_{v \in D}|X_v|$ and $Y=\Sigma_{v \in D}|Y_v|$. It has been shown that $|X_v| \leq 2^{n-3}$; so $X \leq 2^{n-3}|D|$. In addition, $|X_v|+|Y_v|=2^{n-2}$, and so $X+Y=2^{n-2}|D|$. By the definition of $Y_v$, $|U_{v \in D} Y_v| \leq Y/2$, because every element in the above union of sets appears in at least two of the sets. So:

$$\frac{n!}{2} = |Pref_2(S_n)| = |U_{v \in D} X_v| + |U_{v \in D} Y_v| \leq X + \frac{Y}{2} =$$

$$X + 2^{n-3}|D| - \frac{X}{2} = \frac{X}{2} + 2^{n-3}|D| \leq (2^{n-4} + 2^{n-3})|D| = 3 \cdot 2^{n-4}|D|.$$

$$\text{Therefore } |D| \geq \frac{n!}{3 \cdot 2^{n-3}}.$$

Using the above bound, the rate of any full assignment code $\mathcal{C}$ is $$R(C) \leq 1 \frac{1}{n} \log_2 \frac{8}{3}$$

bits per cell. For the case of $n=4$, $|D| \geq 4$. Therefore Construction 1 is an optimal full assignment code.

2. The case of $n=5$

In the case of $n=5$, a dominating set comprises of at least $$\frac{5!}{3 \cdot 2^{5-5}} = 10$$

members. An optimal full assignment code construction is presented with dominating sets of 10 members.

Construction 2.

Divide the 120 states of $S_5$ into 12 sets of 10 states each, where each set is composed of five cosets of $\langle(4,5)\rangle$, and two permutations with the same parity are in the same set if and only if they belong to the same coset of $\langle(1,2,4,3,5)\rangle$. Map each set to a different symbol.

Let $g_1=(4,5)$ and $g_2=(1,2,4,3,5)$. An example of a dominating set where each row is a coset of $g_1$ and each column is a coset of $g_2$ is:

$\{[1,2,3,4,5], [1,2,3,5,4]$ $[2,4,5,3,1], [2,4,5,1,3]$ $[4,3,1,5,2], [4,3,1,2,5]$

[3,5,2,1,4], [3,5,2,4,1]
[5,1,4,2,3], [5,1,4,3,2]}

Theorem 5.

Each set D in Construction 2 is a dominating set.

Proof:

Each coset of $<g_1>$ dominates 4 prefixes in $Pref_3(S_5)$. For example, the coset $<g_1>=\{I_d=[1,2,3,4,5], g_1=[1,2,3,5,4]\}$ dominates the prefixes {[1,2], [1,3], [2,1], [2,3]}. Each coset representative is treated as a representative of the domination over the 4 prefixes in $Pref_3(S_5)$ that are dominated by the coset. According to the construction, a set of representatives in D that share the same parity is a coset of $<g_2>$. Let one of the cosets of $<g_2>$ in D be called C. For each v C, the subset $\{v, g_2*v\}$ represents a domination over a single disjoint prefix in $Pref_4(S_5)$. For example, for $v=I_d$, the subset $\{(I_d=[1,2,3,4,5], g_2*I_d=[2,4,5,3,1]\}$ represent a domination over the prefix [2]. Since $|<g_2>|=5$, C represents a complete domination over $Pref_4(S_5)$, and therefore D is a dominating set.

The rate of the code may be $$R = \frac{1}{s}\log_2 12 = 0.717 \text{ bits per cell}$$

Recall that optimal codes with "push-to-top" operations use only n symbols for in cells. Therefore, a rate improvement of $$\left(\frac{1}{5}\log_2 12\right) / \left(\frac{1}{5}\log_2 5\right) - 1 = 54.4\%$$

may be achieved.

3. The case of r≤2

When the cost constraint is greater than 1, the constructions studied above can be generalized. For a construction for the case r=n−4, the construction begins by dividing the n! states $S_N$ into $$\frac{n!}{120}$$

sets, where two states are in the same set if and only if their first n−5 elements are the same. The sets are all dominating sets, because we can get to any set by at most n−5 "push-to-top" operations. Each of these sets to 12 sets of 10 members is further divided, in the same way as in Construction 2, according to the last 5 elements of the permutations. By the properties of construction 2, each of the smaller sets is still a dominating set. The rate of the code is $$R = \frac{1}{n}\log_2 \frac{n!}{10}$$

bits per cell.

An example method 600 of operating a data device is illustrated in FIG. 6. Method 600 may include one or more operations, actions, or functions as illustrated by one or more of blocks 605, 610, 615, 620, 625, 630 and 635. Although illustrated as discrete blocks, various blocks may be divided into additional blocks, combined into fewer blocks, or eliminated, depending on the particular implementation.

At block 605 the process can be started. Block 605 can be followed by block 610, where data values $V=[V_1, V_2, \ldots, v_n]\in S$ can be received and are to be stored in data storage containing current values $u=[u_1, u_2, \ldots, u_n]\in S$. Block 610 can be followed by block 615, where v can be defined as an element of S. Block 615 can be followed by block 620, where S can be defined as a set of symbols in a rank modulation coding scheme. Block 620 can be followed by 625, where n can be defined as a number of ranks in v to be stored in a group of n rank locations in data storage of the data device. Block 625 can be followed by block 630, where the group of n rank locations can be programmed according to the rank modulation coding scheme and the value v such that for i=n−1, n−2, ..., 1 the programmed value of a rank location $v_i$ is increased until it is greater than the value of a rank location $v_{i+1}$ by a minimum cell differentiation amount. Block 630 can be followed by block 635, where the process may be continued.

In some embodiments each of the n rank locations may comprise a cell of the device data storage. In further embodiments, each rank location may comprise a plurality of cells of the device data storage. In other embodiments, each rank location may comprise an equal number of cells of the device data storage. In still further embodiments, programming may comprise increasing the value of all cells in the rank location $v_i$ until the value in each of the cells $v_i$ is greater than the value in each of the cells in the rank location $v_{i+1}$. In other embodiments, the current values of $u=[u_1, u_2, \ldots, u_n]\in S$ are read from the device data storage before the programming of the group of n rank locations with v.

III. MULTI-CELLS

We can store $\log_2 q$ bits on a flash cell with q levels. That way, each time we want to update the data on the memory, we would have to erase the whole block. We call this representation method "the trivial scheme". We could also use a bit more sophisticated update schemes. For example, we could store only 1 bit in each cell, according to the parity of the level of the cell. If the cell is in level 3, for example, it stores the value 1. Using this scheme, we can update the data q−1 times before a block erasure will be required. We call this scheme "the parity scheme". Update schemes like the parity scheme can be especially useful for enterprise applications of flash memory, where the endurance of the memory becomes a major design concern. Update schemes are also known as write once memory (WOM) codes. See, for example, A. Fiat and A. Shamir, "Generalized "write-once" memories," *IEEE Trans. on Inform. Theory*, vol. IT-30, no. 3, pp. 470-480, May 1984; F.-W. Fu and A. J. Han Vinck, "On the capacity of generalized write-once memory with state transitions described by an arbitrary directed acyclic graph," *IEEE Trans. on Inform. Theory*, vol. 45, no. 1, pp. 308-313, January 1999; R. L. Rivest and A. Shamir, "How to reuse a "write-once" memory," *Inform. and Control*, vol. 55, pp. 1-19, 1982.

While the values of the cells in the relative scheme don't need to be quantized, discrete levels can be used for analysis to simplify the calculations. This is to allow a more easy and useful analysis, and because there should still be a certain charge difference between the cells in order to avoid errors. When the cells have q levels, the data can be stored on a set of q cells according to their relative levels. In other words, $\log_2(q!)$ bits can be stored on q cells, or each cell can be used to store $(1/q)\log_2(q!)$ bits. If q is large, the capacity of the trivial scheme described above. However, various update schemes described herein can be employed that may use relative levels, such as n cells of q levels, where n<q. As described further below, a high total capacity can be achieved with update schemes that use relative cell's levels. More specifically, some described examples may achieve an instantaneous capacity of n bits and a total capacity of (q−1)n bits using relative cell's levels.

Update schemes with high total capacity can become useful when q has a high value. However, in practical flash memory devices, q may have a moderately small number. Various example methods described herein may achieve high values of q with the existing cell technology. The main idea is to combine several floating gate transistors into a virtual cell, which we call a multi-cell.

A. Multi-Cell Flash Memory

NAND flash memory is a widely used type of memory for general storage purposes. In NAND flash, several floating gate transistors are typically coupled in series (see FIG. 7A), where read or write operations occur one at a time. The present disclosure proposes to replace various transistors with a multi-cell of m transistors that are coupled together in parallel, with commonly controlled gates, as shown in FIG. 7B. In read operations, the currents of the transistors sum together, and the read precision may increase by m times, allowing to store mq levels in a single multi-cell. In write operations, the same value can be written into all of the transistors coupled together with a common gate, such that the sum of their charge levels gives the desired total level. The resulting error rates of read and write operations of the configuration in FIG. 7B are substantially the same as those error rates found in a traditional flash cell.

If data is stored by n transistors that form n/m multi-cells of mq levels each, and if the trivial scheme is used, an instantaneous and total capacity of (n/m)log$_2$(mq) bits results that is less than the n log$_2$q bits would result using traditional cells. However, if an update scheme such as the relative schemes presented in the present disclosure, then a total capacity may approach n(q−1) bits both with multi-cells and with traditional cells. In order to use a permutation of cell's levels, the number of levels in each should be at least the number of cells. To approach a total capacity of n(q−1) bits with permutations, the number of updates the scheme can take should be greater than the number of cells we use. By using multi-cells, the number of updates may increase at the expense of the instantaneous capacity, and the total capacity is approached faster.

B. Notations and Model Properties

In order to allow easy and fair analysis, discrete levels for the cell's charge values can be utilized. In practice there is generally no need for threshold levels, and analog values can be used for the cell's charge values. For example, let c=(c$_1$, c$_2$, ..., c$_n$), with c$_i$∈{0, 1, ..., q−1} as the state of an array of n flash cells, each cell having q discrete levels, where c$_i$≠c$_j$ for all i≠j. The n variables may induce a permutation such as σ=[σ(1), σ(2), ..., σ(n)]∈S$_n$, where S$_n$ denotes the set of all permutations over [n]=(1, 2, ..., n). The permutation σ may be uniquely defined by the constraints c$_{σ(i)}$>c$_{σ(j)}$ for all i>j, i.e., when c is sorted in ascending order as c$_{j_1}$<c$_{j_2}$<...<c$_{j_n}$, then σ(i)=j$_i$ for all 1≤i≤n.

To change the permutation from σ to σ', the cells can be programmed based on their order in σ', so that each cell's level may increase as little as possible. For example, let c'=(c'$_1$, c'$_2$, ..., c'$_n$) denote the new cell's levels to be set. Initially c'$_{σ'(1)}$=c$_{σ'(1)}$, and then, for i=2, 3, ..., n, c'$_{σ'(i)}$=max{c$_{σ'(i−1)}$+1}. Given two cell states c and c', let cost (c→c') denote the cost of changing the cell state from c to c'. The cost can be defined as the difference between the levels of the highest cell, before and after the update operation. Namely, cost (c→c')=c'$_{σ'(n)}$−c$_{σ(n)}$. As illustrated by this example, the cost may be a function of σ$^{-1}$ and σ'$^{-1}$, where σ$^{-1}$ is the inverse of the permutation σ. See, for example, E. En Gad, A. Jiang, and J. Bruck, "Compressed encoding for rank modulation," in *Proceedings of the 2011 IEEE Int. Symp. on Inform. Theory*, ISIT2011, St. Petersburg, Russia, August 2011, pp. 884-888. The cost can be written as:

$$\text{cost}(σ → σ^j) = \max_{i∈[n]}(σ^{-1}(i) − σ^{j-1}(i)).$$

In other words, the cost is the L$_∞$ quasimetric.

Example 1

Let c=(0, 1, 2, 3). So σ=[1,2,3,4]. Now let σ'=[3,1,4,2]. The levels of the cells to represent σ' can be increased as follows: set c'$_3$=c$_3$=2; c'$_1$=max{c$_1$, c'$_3$+1}=max{0,3}=3; and c'$_4$=4 and c'$_2$=5. The cost of the update can be determined as c'$_2$−c$_4$=5−3=2. The cost can also be calculated directly from the permutations: σ$^{-1}$=[1,2,3,4], and σ'$^{-1}$=[2,4,1,3]. Since σ$^{-1}$−σ'$^{-1}$=[−1, −2,2,1], and the maximum is 2, so this is the cost.

The set of all the values that the data can take can be denoted as D. An update scheme, or update code, $\mathcal{C}$ may include a decoding function $f$ and an update function g. The decoding function $f$:S$_n$→D may identify the permutation σ∈S$_n$ as a representation of the data $f$(σ)∈D. The update function (which may represent an update operation), g:S$_n$×D→S$_n$, may identify the current permutation σ∈S$_n$ and the update can change the data to d∈D, and the update code can change the permutation to g(σ, d), where $f$(g(σ, d)) may be equal to d. Note that if $f$(σ)=d, then g(σ, d)=σ, which corresponds to the case where w the stored data does not need to change.

Let C$_i$($\mathcal{C}$) be the instantaneous capacity of an update code $\mathcal{C}$. The instantaneous capacity can be defined as C$_i$($\mathcal{C}$)=(1/n)log|D|, where the binary logarithm can be usedr. Let t$_w$($\mathcal{C}$) be the maximal number of updates that $\mathcal{C}$ can support for all update sequences. The worst-case total capacity per level can be defined as C$_w$($\mathcal{C}$)=t$_w$($\mathcal{C}$)C$_i$($\mathcal{C}$)/(q−1). Similarly, t$_a$($\mathcal{C}$) can be defined as the average number of times the memory can be modified before a block erasure is required, where we assume that in each update, the data value can be uniformly distributed, C$_a$($\mathcal{C}$)=t$_a$($\mathcal{C}$)C$_i$($\mathcal{C}$)/(q−1) can be the average total capacity per level of the update code, and see that lim$_{q/n,n→∞}$C$_a$($\mathcal{C}$)=C$_i$($\mathcal{C}$)/E(cost), where E(cost) is the expectation of the cost.

Finally, for a fixed σ∈S$_n$, set $$B_{n,r}(σ)=\{σ'∈S_n|\text{cost}(σ→σ')≤r\}, k_{n,r}=|B_{n,r}(σ)|.$$

We note that k$_{n,r}$ is independent of σ. It was shown in [2] that k$_{n,r}$=(r+1)$^{n-(r+1)}$(r+1)!

C. Upper Bounds

In this section, a bound is derived for C$_w$($\mathcal{C}$) and C$_a$($\mathcal{C}$), when q and n are large numbers, and q is much greater than n. In addition, a bound for C$_i$($\mathcal{C}$) is derived in the cases where C$_w$($\mathcal{C}$) and C$_a$($\mathcal{C}$) are asymptotically optimal.

1. Worst Case

To derive a bound, k$_{n,r}$, the size of the ball of radius r can be used. To guarantee that the cost of each update operation is no more than r, |D|≤k$_{n,r}$. Otherwise, to write the data state d, there is no guarantee that there is a permutation in B$_{n,r}$(σ) that represents d. The resulting instantaneous capacity can be determined as (1/n)log(k$_{n,r}$). Let K$_r$=lim$_{n→∞}$(1/n)log(k$_{n,r}$). By setting C$_i$($\mathcal{C}$)<K$_r$, we cannot guarantee to write more than (q−n)/r times, so C$_w$($\mathcal{C}$)=t$_w$($\mathcal{C}$)C$_i$($\mathcal{C}$)/(q−1) is less than K$_r$/r. In the following K$_r$/r is decreasing in r, which means that K$_1$ is an upper bound to the worst case total capacity.

Lemma 1.

$K_r/r$ is strictly decreasing in r when $r \geq 1$.

Proof:

$$(1/nr)\log k_r = (1/nr)\log((r+1)^{n-(r+1)}(r+1)!)$$
$$\geq (1/nr)(n\log(r+1) - (r+1))$$
$$= (1/r)\log(r+1) - (r+1)/(nr)$$
$$\to (1/r)\log(r+1), n \to \infty$$

So $K_r/r \geq (1/r)\log(r+1)$.

On the other hand, $$(1/(n(r+1)))\log k_{r+1} = \frac{\log((r+2)^{n-(r+2)}(r+2)!)}{n(r+1)} \leq (1/(r+1))\log(r+2)$$

So $K_{r+1}/(r+1) \leq (1/(r+1))\log(r+2) < (1/r)\log(r+1) \leq K_r/r$.

So $K_r/r$ is strictly decreasing.

It also follows that when $C_w(\mathcal{C})$ is asymptotically optimal, $C_i(\mathcal{C})$ is bounded by $K_1$ as well. And when $C_i(\mathcal{C})$ is asymptotically optimal, $t_w(\mathcal{C})$ is optimal, since r=1. As noted, both upper bounds are determined as $K_1$. We can calculate $K_1$ quickly: $K_1 = \lim_{n \to \infty}(1/n)\log 2^{n-1} = 1$. In section 6 we show that there exists a code that approaches both of the bounds.

2. Average Case

We now find a bound for the average case. Since $t_w(\mathcal{C}) \leq t_a(\mathcal{C})$, the average total capacity is at least that of the worst case. In the following theorem we show that, asymptotically, the average total capacity is also bounded by $K_1$.

Theorem 1.

Let $\mathcal{C}$ be a permutation based update code. Then $\lim_{q/n,n\to\infty} C_a(\mathcal{C}) \leq K_1$. Proof: Let r be the largest integer such that $\lim_{n\to\infty} C_i(\mathcal{C}) > K_r$. Therefore, $\lim_{n\to\infty} C_i(\mathcal{C}) \leq K_{r+1}$. Let $d \in D$ be a data state that needs to be stored, and $\sigma \in S_n$ the current permutation of the cells. Since $f(\sigma)$ is the decoding function, let $f^{-1}(d)$ be the set of permutations that are decoded to d. We start by bounding E(cost), the expected cost of an update:

$$E(\text{cost}) = \sum_{i=0}^{n-1} i \Pr\{\text{cost} = i\} \geq (r+1)\Pr\{\text{cost} \geq r+1\} =$$
$$(r+1)\Pr\{f^{-1}(d) \cap B_{n,r}(\sigma) = \emptyset\} \geq (r+1)(1 - \Pr\{dk_{n,r}\}) =$$
$$(r+1)(1 - k_{n,r}/D) = (r+1)(1 - 2^{n(K_r - C_i(C))})$$
$$C_a(C) = t_a(C)C_i(C)/(q-1) \leq (q-n)C_i(C)/((q-1)E(\text{cost})) \leq$$
$$C_i(C)/((r+1)(1 - 2^{n(K_r - C_i(C))}))$$

Since $\lim_{n\to\infty} C_i(C) K_{r+1}$, $$\lim_{q/n,n\to\infty} C_a(C) \leq \lim_{q/n,n\to\infty} K_{r+1}/((r+1)(1 - 2^{n(K_r - C_i(C))})) = K_{r+1}/(r+1) \leq K_1$$

where the last step is due to Lemma 1.

Once $\lim_{n/q,n\to\infty} C_a(\mathcal{C})$ is optimized, we also want to optimize $C_i(\mathcal{C})$. We now derive an upper bound for that case.

Theorem 2.

Let $\mathcal{C}$ be a permutation based update code. If $C_a(\mathcal{C}) \to K_1$ when $q/n, n \to \infty$, then $\lim_{n\to\infty} C_i(\mathcal{C}) \leq K_1$.

Proof:

Set r as before. Therefore, $\lim_{n\to\infty} C_i(\mathcal{C}) \leq K_{r+1}$. If $r \geq 1$, $\lim_{q/n,n\to\infty} C_a(\mathcal{C}) \leq K_{r+1}/(r+1) < K_1$, since $K_r/r$ is strictly decreasing, and we have a contradiction, since $C_a(\mathcal{C})$ doesn't approach $K_1$. So r=0, and therefore $\lim_{n\to\infty} C_i(\mathcal{C}) \leq K_1$.

We see that once $C_i(\mathcal{C})$ is asymptotically optimal, $t_a(\mathcal{C})$ is asymptotically optimal as well.

D. Construction for the Average Case

We now present a code that achieves both bounds with efficient decoding and update procedures. For convenience, we assume that both log n and n/log n are integers.

Let each data state be a factorial number (also known as a reflected inversion vector) with n/log n digits, $d=(d_0, \ldots, d_{n/\log n-1})$. The i-th digit from the right in a factorial number has base i, which means that the digit is less than i. Therefore, the base of digit $d_i$ is n/log n−i.

We can see that the instantaneous capacity of the code is asymptotically optimal. That is because:

$$C_i(C) = (1/n)\log|D|$$
$$= (1/n)\log((n/\log n)!)$$
$$\geq \frac{n}{n\log n}(\log n - \log(2\log n))$$
$$= 1 - \log(2\log n)/\log n \to 1, n \to \infty$$

Construction 1.

Permutation based update code.

Decoding:

The decoding function, $f(\sigma)$, can be used to decode a permutation σ to a data state d. The permutation σ can be written as a sequence of log n permutations, $\sigma=(\sigma_0, \sigma_1, \ldots, \sigma_{\log n-1})$, each taken over n/log n cells. For the purpose of decoding, we first represent the permutations as factorial numbers. Namely, for each permutation σ, its factorial is $V_j=(V_j(0), V_j(1), \ldots, V_j(n/\log n-1))$, with $V_j(i)=|\{k|k>i \text{ and } \sigma_j(k)>\sigma_j(i)\}|$. In other words, each element is the number of elements following the element in the permutation that are greater than it.

The decoding function may be composed of a sequence of digit functions $f_0, f_1, \ldots, f_{n/\log n-1}$, each decoding a different digit. Each digit function $$f_i: \left\{0, 1, \ldots, \frac{n}{\log n} - 1 - i\right\}^{\log n} \to \left\{0, 1, \ldots, \frac{n}{\log n} - 1 - i\right\}$$

can be used to decode the digit $d_i$ according to the vector $V(i)=\{V_0(i), V_1(i), \ldots, V_{\log n-1}(i)\}$. Together, $f(\sigma)=f(V)=(f_0(V(0)), f_1(V(1)), \ldots, f_{n/\log n-1}(V(n/\log n-1)))$. Each function $f_i(V(i))$ can take the value of the sum of the digits with index i in the log n factorial numbers. The sum can be taken as a modulo of the base of the digit, (n/log n−i):

$$f_i(V(i)) = \Sigma_{j=0}^{\log n-1} V_j(i) \bmod (n/\log n-i)$$

Update:

The update function, $g(\sigma, d)$, updates the permutation σ into a permutation σ', such that $f(\sigma')=d$. The function takes place sequentially from $d_0$ to $d_{n/\log n-1}$. The update function is described by the following algorithm:

1: Set $\sigma'=\sigma$, $V'_j$ the factorial number of $\sigma'_j$, and start with digit $d_0$, i.e. i=0.

2: Identify a sequence $s=(s_0, s_1, \ldots, s_{\log n-1})$ of log n bits, such that if, for each j, we perform the transposition $(i, i+s_j)$ on $\sigma'_j$, then $f_i(V'(i))=d_i$. If such a sequence is found, perform the transpositions according to s and repeat phase 2 for the next digit, $d_{i+1}$.

3: If there is no binary sequence s such that $f_i(V'(i))=d_i$, identify a ternary sequence s of length log n, i.e., $s_j \in \{0,1,2\}$, such that $f_i(V'(i))=d_i$. If such a sequence is identified, the transpositions can be performed according to s and repeat phase 2 for the next digit.

4: If there is still no appropriate binary sequence s, an arbitrary index j is selected, and update $\sigma_j$ to an appropriate $\sigma'_j$ such that $f(V')=d$.

Example 2

Let n=16. Let $\sigma_j$=[1,2,3,4] for j=0,1,2,3. For each j, $V_j(0)$=3, since there are 3 elements following the element 1 in $\sigma_j$ that are greater that 1. Now we decode the data from the permutations. $f_0(V(0))$=3+3+3+3 mod(4−0)=0, so $d_0$=0. Similarly, $d_1$=2×4 mod(4−1)=2, $d_2$=4 mod 2=0 and $d_3$=0. Note that $d_{n/\log n-1}$=0.

We now assume that we want to update the data state to d=(2,2,0,0). We start with encoding $d_0$=2. We look for a binary sequence s such that $f_0(V'(0))$=2. We notice that for each j, if $s_j$=0, then $V'_j(0)$=3, and if $s_j$=1, then $V'_j(0)$=2. So we can choose, for example, the sequence s=(1,1,0,0), and get $f_0(V'(0))$=2+2+3+3 mod 4=2. In the same way we can encode each digit in the data state.

We remember that the cost of update is the $L_\infty$ quasimetric: cost$(\sigma \to \sigma')$=$\max_{i \in [n]}(\sigma^{-1}(i)-\sigma'^{-1}(i))$. Therefore, if all the digits are updated by phase 2, the cost of the update operation is 1. The number of binary sequences of length log n is n, and therefore the algorithm can check all of them in polynomial time. In order to avoid the calculation of the sum for each sequence, the algorithm can use a binary reflected Gray code, and calculate only the difference of one transposition in each step.

If at least one digit is updated by phase 3, the cost of the update is 2. The running time of the algorithm remains polynomial in that case. If the algorithm reaches phase 4, the cost can be determined as n/log n−1, but the running time remains polynomial, since we can choose the elements of $V'_j$ quickly. Since all the steps in the update algorithm take polynomial time, the worst-case complexity is polynomial in n.

We now analyze the expected cost of update. We assume that $\sigma$ and d are drawn according to uniform distributions, and start with calculating the probability that the cost is greater than 1. For every binary sequence s, Pr$(f_i(V'(i))=d_i)$ is at least log(n)/n, since the base of $d_i$ is at most n/log n. So the probability that s is not good is at most 1−(log n/n). s can take one of n values, and for each different value that probability is independent. Therefore, the probability that there is no good sequence s is at most $(1-(\log n/n))^n$. That probability is independent for different digits of d. Therefore, by the union bound, the probability that at least one digit is updated according to phase 3 is at most $(n/\log n)(1-(\log n/n))^n$. This is the probability that the update cost will be greater than 1. Similarly, the probability that the update cost is greater than 2 is at most $(n/\log n)(1-(\log n/n))^{3^{\log n}}$, since phase 3 uses ternary sequences. We now show that the expected cost of the update algorithm is approaching 1:

$$E(\text{cost}) = \sum_{i=0}^{n/\log n - 1} i Pr(\text{cost}=i) \le$$

$$1Pr(\text{cost}=1) + 2Pr(\text{cost}=2) + (n/\log n)Pr(\text{cost}>2) \le$$

$$1 + 2(n/\log n)(1-(\log n/n))^n + (n^2/\log^2 n)(1-(\log n/n))^{3^{\log n}} \le$$

$$1 + (2n/\log n)\exp(-\log n) + (n^2/\log^2 n)\exp(-n^{\log 3-1}\log n) \to 1, n \to \infty$$

So $C_a(\mathcal{C})=t_a C_i(\mathcal{C})/(q-1) \to 1$ when q/n,n→∞, and the code approaches the bounds for the instantaneous and the average total capacity.

E. Existence for the Worst Case

In this section we show that there exists a code such that $C_i(\mathcal{C})$, $C_w(\mathcal{C})$ both approach $K_1$ when q/n,n→∞.

Theorem 3.

There exists a permutation based update code $\mathcal{C}$, such that $C_i(\mathcal{C})$, $C_w(\mathcal{C}) \to K_1$ for q/n,n→∞.

Proof:

Let $|D|=k_{n,1}/n^{1+\epsilon}$, where $\epsilon$ is a positive constant. In the following we show that there exists a {D, n} code with worst case update cost of 1. We first calculate the instantaneous capacity of the code:

$$C_i(C) = (1/n)\log|D|$$

$$= (1/n)\log k_{n,1} - (1/n)(1+\varepsilon)\log n \to K_1, n \to \infty$$

So the instantaneous capacity of such a code is asymptotically optimal. If we show that the worst-case cost is 1, it follows that the worst-case total capacity is also asymptotically optimal.

Suppose $\{f^{-1}(d)\}_{d=1}^{|D|}$ is a partition of $S_n$, i.e., $f^{-1}(d) \cap f^{-1}(d')=\emptyset$, d≠d'; and $\cup_{d=1}^{|D|} f^{-1}(d)=S_n$. We now show that there exists a partition of $S_n$, such that for any $\sigma \in S_n$ and any d∈D, there exists a vector $\sigma' \in f^{-1}(d)$, such that cost$(\sigma \to \sigma')$=1. We use a random coding method. With every $\sigma \in S_n$, we connect a random index $r_b$ which is uniformly distributed over the data set D, and all these random indices are independent. Then $\{f^{-1}(d)\}_{d=1}^{|D|}$ forms a random partition of $S_n$. Fix d∈D and $\sigma \in S_n$, then $$Pr\{f^{-1}(d) \cap B_{n,r}(\sigma) = \emptyset\} =$$

$$Pr\{\forall \sigma B_{n,r}(\sigma), r_b \ne d\} = [1-1/|D|]^{k_{n,1}} \exp\{-k_{n,1}/|D|\} = \exp\{-n^{1+\varepsilon}\}$$

Therefore, $Pr\{\exists d \in D \text{ and } \sigma \in S_n, \text{ s.t. } f^{-1}(d) \cap B_{n,r}(\sigma) = \emptyset\} \le$ $$|D||S_n|\exp\{-n^{1+\varepsilon}\} \le 2^n n! \exp\{-n^{1+\varepsilon}\} \le \exp\{n(1+\ln n - n^\varepsilon)\} \to 0, n \to \infty$$

This implies that when n is sufficiently large, there exists a partition of $S_n$ such that the cost of each update is 1.

Figure 8A:
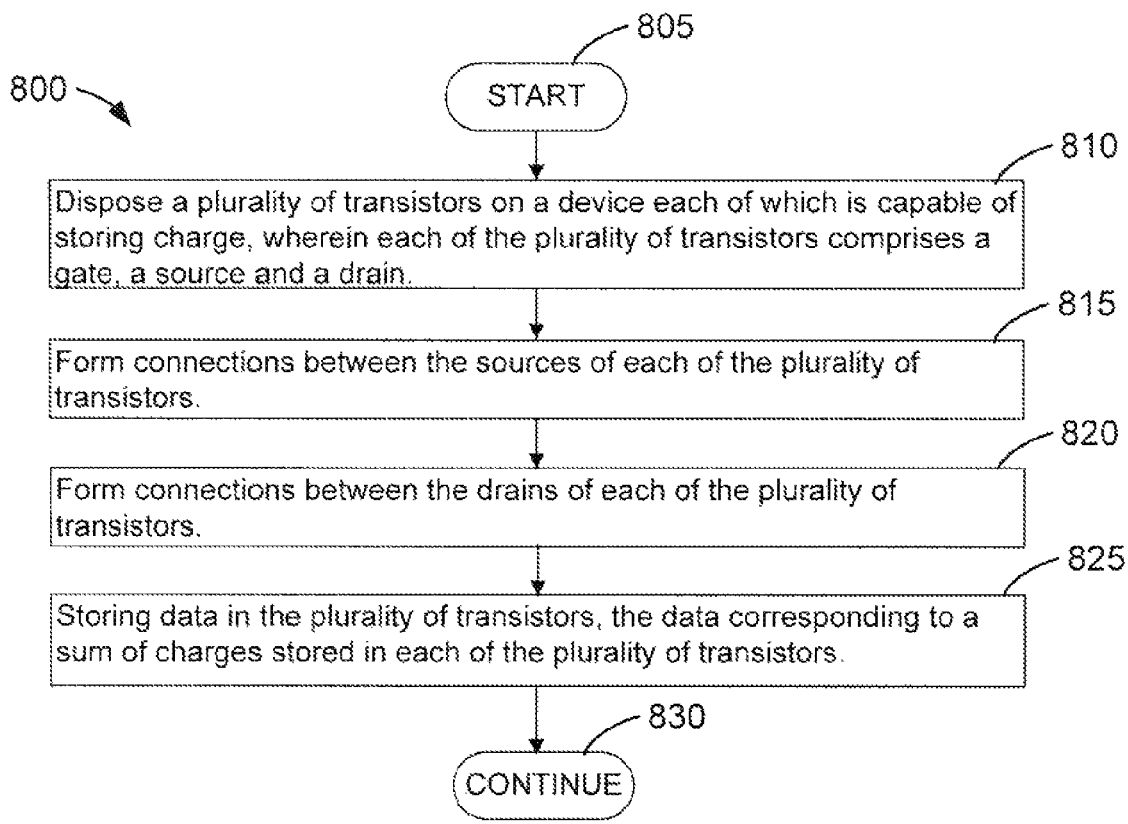
FIG. 8A is a process for manufacturing and operating a data storage device in accordance with the description herein.

FIG. 8A depicts a process 800 for manufacturing and operating a data device. Process 800 may include one or more operations, actions, or functions as illustrated by one or more of blocks 805, 810, 815, 820, 825 and 830. Although illustrated as discrete blocks, various blocks may be divided into additional blocks, combined into fewer blocks, or eliminated, depending on the particular implementation. The process starts with block 805. In block 810 a plurality of transistors each of which is capable of storing charge are disposed on a device. Each of the plurality of transistors comprises a gate, a source, and a drain. In block 815 connections are formed between the sources of each of the plurality of transistors. Each connection is capable of carrying electrical current. In block 820 connections are formed between the drains of each of the plurality of transistors. Each connection is capable of carrying electrical current. In block 825 data is stored in the plurality of transistors. The data corresponds to a sum of charges stored in each of the plurality of transistors. In block 830 the process may continue. In some embodiments connections may be formed between the gates of each of the plurality of transistors.

Figure 8B:
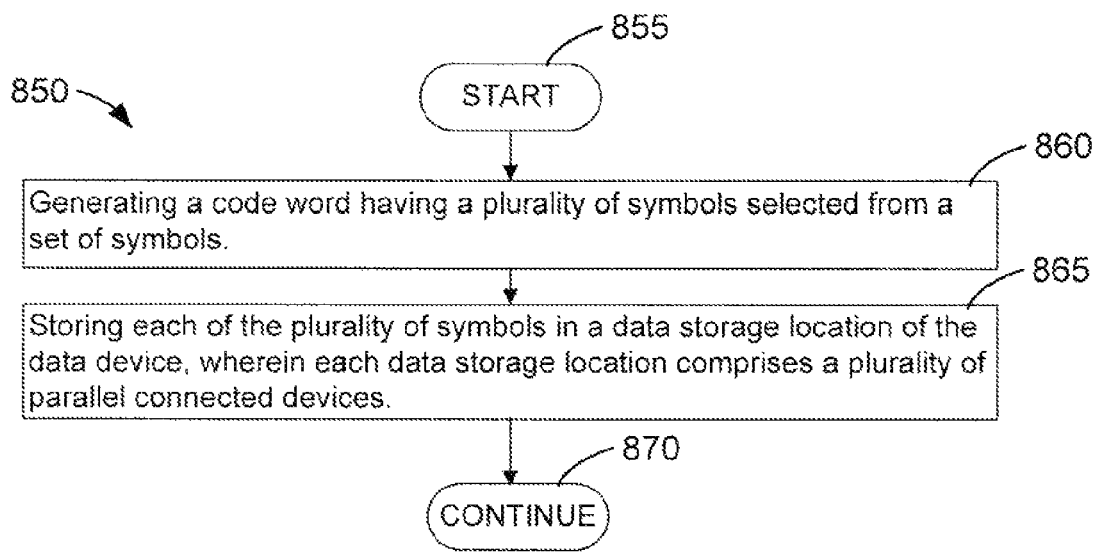
FIG. 8B is a process for operating a data storage device in accordance with the description herein.

FIG. 8B depicts a process 850 for operating a data device. Process 850 may include one or more operations, actions, or functions as illustrated by one or more of blocks 855, 860, 865 and 870. Although illustrated as discrete blocks, various blocks may be divided into additional blocks, combined into fewer blocks, or eliminated, depending on the particular implementation. The process starts with block 855. In block 860 a code word is generated that has a plurality of symbols selected from a set of symbols. In block 865 each of the plurality of symbols is stored in a data storage location of the data device. Each data storage location comprises a plurality of parallel connected devices. In block 870 the process may be continued. In some embodiments the plurality of parallel connected devices may comprise transistors.

IV. MULTI-PERMUTATIONS

We further generalize the paradigm of representing information with permutations to the case where the number of cells in each level is a constant greater than 1, multi-permutations. Namely, the states that the cells can take are no longer permutations of a set, but permutations of a multiset. For example, if the number of cells at each level is 2, the two cells in each level do not need to be identical in their analog values, they just need to be distinguishable with other levels (but do not need to be mutually distinguishable). Hence, the encoding and decoding may use relative levels, and the scheme has good resistance to drift; namely, the advantages of the permutation based relative scheme that we described above still apply. Another example is the case where the number of levels is 2, and there are many cells in each level. In this case, the multi-permutations are balance binary sequences.

We consider the case where the multiplicities of all the elements in the multiset are equal, and denote it by z. This generalization becomes interesting especially when z is large, and n is still much larger than z. In that case (if q is still much larger than n), we can prove that the upper bound on the total capacity is 2q bits per cell, and that there exists a construction that approaches this bound. The instantaneous capacity of the construction is approaching 2 bits per cell. These results can be proved using similar techniques to those we used in the theorems described in this paper. Since the cost of each update is at least 1, the number of updates is at most q−1. We note that when the number of updates is at most q−1, it follows that the total capacity of an update scheme, even without relative levels, is no higher than 2 q bits per cell, and that there exists a code that achieves this bound. See, for example, F.-W. Fu and A. J. Han Vinck, "On the capacity of generalized write-once memory with state transitions described by an arbitrary directed acyclic graph," *IEEE Trans. on Inform. Theory*, vol. 45, no. 1, pp. 308-313, January 1999. However, our generalization makes a stronger claim—that there exists a code that uses multisets (relative levels) and achieves the total capacity of 2q bits per cell. It is still an open problem to find a construction that achieves 2q bits per cell.

A. Compressed Rank Modulation

We will focus on the new multi-permutations scheme introduced above, which we call Compressed Rank Modulation. Before we do that, let us first review the terms in the original rank modulation scheme. There are n cells, whose analog levels can be denoted by $c_1, c_2, \ldots c_n$. (For flash memories, the analog level of a cell may correspond to its charge level or threshold-voltage level. For phase-change memories and memristors, the analog level of a cell may correspond to its resistance level.) They induce a permutation $[x_1, x_2, \ldots, x_n]$ of the set $\{1, 2, \ldots, n\}$, such that $$c_{x_1} < c_{x_2} < \ldots < c_{x_n}.$$

Figure 9:
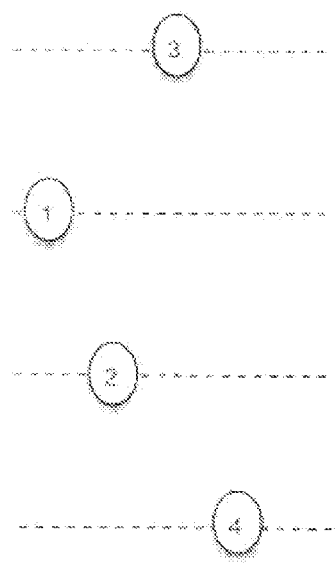
FIG. 9 is a representation of a memory cell arrangement in accordance with the description herein.

For $i=1, 2, \ldots, n$, the $x_i$-th cell is said to have rank i. An example is shown in FIG. 9, where n=4 cells induce the permutation [4,2,1,3].

Rank modulation may have two advantages:
 Cell programming is efficient and robust. We can program cells from the lowest level to the highest level, without the risk of overshooting, and there may be no need to accurately control the level of any cell.
 The state of the cells can be read in a simple way. For the n cells, their ranks can be determined by sorting. That is, we just need to measure the order of the cell levels. There may be no need to measure the exact value of the cell levels.

Figure 10:
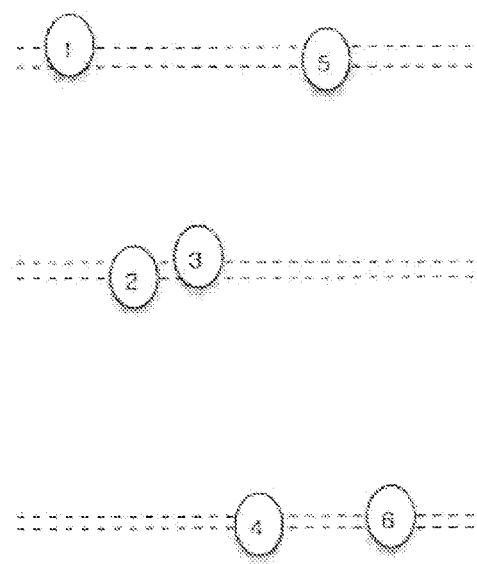
FIG. 10 is a representation of a memory cell arrangement in accordance with the description herein.

We now introduce the new scheme called, Compressed Rank Modulation. Let n and $d_1, d_2, \ldots, d_n$ be parameters that are positive integers. There are $d_1+d_2+\ldots+d_n$ cells, whose analog levels are denoted by $c_1, c_2, \ldots, c_{d_1+d_2+\ldots+d_n}$. They are assigned n different ranks based on their analog levels, where the $d_1$ cells of the lowest analog levels are assigned rank 1, the next $d_2$ cells are assigned rank 2, ..., and the top $d_n$ cells are assigned rank n. An example is shown in FIG. 10, where n=3, $d_1=d_2=d_3=2$, and the induced permutation is

[{4,6},{2,3},{1,5}]

(namely, cell 4 and cell 6 have rank 1 (the lowest rank), cell 2 and cell 3 have rank 2 (the middle rank), and cell 1 and cell 5 have rank 3 (the highest rank)).

Another example is as follows:

Example 3

Let n=3, $d_1=2$, $d_2=3$, $d_3=4$. We assign $\Sigma_{i=1}^{n} d_i=9$ cells to n=3 ranks, such that $d_1$ cells are assigned to rank 1, $d_2$ cells are assigned to rank 2, and $d_3$ cells are assigned to rank 3. For example, the following permutation is valid.

[{1,5}, {2,3,8}, {4,6,7,9}].

The main advantage of Compressed Rank Modulation, compared to rank modulation, is that cells of the same rank can be programmed to very close analog levels. In the original rank modulation, in order to tolerate noise, we want there to be a sufficiently large gap between every two analog cell levels. In the compressed rank modulation, however, for cells of the same rank, their analog levels can be arbitrarily close. (And when we program cells, we would like to make cells of the same rank to have very close analog levels, so that the gap between the analog cell levels of different ranks can be large.) This way, we can pack more cells into the group of cells that use rank modulation. And the storage capacity can be increased.

Example 4

This Example illustrates that the compressed rank modulation can improve the storage capacity. In this example, cells of the same rank can be programmed to arbitrarily close analog levels (just for the sake of explanation). For cells of adjacent ranks, in this example, the gap between their analog levels can be assumed to be Δ.

Consider the compressed rank modulation with n=3 and $d_1=d_2=d_3=2$. The rank modulation can represent $$\binom{6}{2}\binom{4}{2} = 90$$

symbols.

For fair comparison, for the original rank modulation scheme, consider 6 cells that we partition equally into 2 groups, where every group employs the rank modulation scheme. Since each group can represent 3!=6 symbols, the two groups can together represent 6×6=36<90 symbols. So the compressed rank modulation achieves higher storage capacity.

The compressed rank modulation scheme may have the advantages of the original rank modulation scheme:

Cell programming is efficient and robust. When programming cells, we program them from the lowest rank to the highest rank, without the risk of overshooting. Note that for cells of the same rank, the order of their analog levels does not matter. There is no need to accurately control the analog level of any cell.

The state of the cells can be read in a simple way. All we need is still just sorting. The $d_1$ cells of the lowest analog levels have rank 1, the next $d_2$ cells have rank 2, . . . , and the top $d_n$ cells have rank n.

We emphasize again that for cells of the same rank, their analog levels can have arbitrary orders. That makes programming simple. For example, the examples in FIGS. 11 and 12 may induce the same permutation as the example in FIG. 10. Of course, given the permutation [{4,6}, {2,3}, {1,5}], we prefer to program it as FIG. 10 or FIG. 12 instead of FIG. 11, in order to have larger gaps between the analog cell levels of different ranks.

1. Initial Write

In this section, we discuss how to write data in the compressed rank modulation scheme.

For flash memories (or PCMs, etc.), when data are written to cells for the first time, typically, all the cells are in the same initial state. (Typically, they all have the lowest analog levels.) So given a permutation $[\{x_1, x_2, \ldots, x_{d_1}\}, \{x_{d_1+1}, x_{d_1+2}, \ldots, x_{d_1+d_2}\}, \ldots, \{x_{1+\sum_{i=1}^{n-1}d_i}, x_{2+\sum_{i=1}^{n-1}d_i}, \ldots, x_{\sum_{i=1}^{n}d_i}\}]$, we can program the cells from the lowest rank to the highest rank, in the following way:

1. Let $\Delta>0$ be a parameter we choose. Let cells of rank 1—namely, the $x_1$th cell, the $x_2$th cell, . . . , the $x_{d_1}$th cell—retain their analog levels.

2. For i=2, 3, . . . , n, do:

Program the cells of rank i such that their analog levels are all higher than the analog levels of the cells of rank i−1 by at least $\Delta$.

It is easy to see that the above programming method has little to no risk of overshooting, and enables cells to be programmed efficiently without the need to accurately control analog cell levels. It is especially useful for flash memories, where cell levels can only be increased before the very costly block erasure operation is taken.

2. Subsequent Rewrites

After data are written into cells, there are at two scenarios where it may be necessary to program the cells again. In the first scenario, the value of the data needs to be changed. In the second scenario, the analog cell levels of the cells are disturbed by noise, and cells need to be reprogrammed to ensure data reliability. If various cells need to be reprogrammed by increasing cell levels (which is performed for flash memories and sometimes also for PCMs), the cells can be programmed with the following method.

Let $(c_1, c_2, \ldots, c_{d_1+d_2+\ldots+d_n})$ denote the initial analog levels of the cells. Let $[\{x_1, x_2, \ldots, x_{d_1}\}, \{x_{d_1+1}, x_{d_1+2}, \ldots, x_{d_1+d_2}\}, \ldots, \{x_{1+\sum_{i=1}^{n-1}d_i}, x_{2+\sum_{i=1}^{n-1}d_i}, \ldots, x_{\sum_{i=1}^{n}d_i}\}]$ denote the new permutation we need to program into the cells, and let $(c_1', c_2', \ldots, c_{d_1+d_2+\ldots+d_n}')$ denote the new analog cell levels to be set. We can program the cells from the lowest rank to the highest rank as follows:

1. Let $\Delta>0$ be a parameter we choose. For cells of rank 1—namely, the $x_1$th cell, the $x_2$th cell, . . . , the $x_{d_1}$th cell—they can either retain their analog levels, or be programmed slightly such that their analog levels become close to each other.

2. For i=2, 3, . . . , n, do:

Program the cells of rank i such that their analog levels are higher than the analog levels of the cells of rank i−1 by at least $\Delta$. In addition, if desirable, we can also make their analog levels be close to each other.

It can be seen that the programming method is essentially the same as the one for the initial write. It also avoids overshooting programming errors, and is robust and efficient.

3. Programming Symmetric Cells

For some memories (such as phase-change memories and memristors), their cell levels can be both increased and decreased without block erasures. In such a symmetric case, it becomes even easier to program cells for the compressed rank modulation scheme. Those skilled in the art will understand how to program cells for this case.

4. Rebalancing Permutations

A compressed rank modulation code has $$\binom{d_1+d_2+\cdots+d_n}{d_1}\binom{d_2+d_3+\cdots+d_n}{d_2}\cdots\binom{d_{n-1}+d_n}{d_{n-1}}$$

permutations. We can directly use them to encode data, either with a one-to-one mapping or with an error-correcting code. In the following, we describe two additional methods for encoding data, which can be especially useful if the number of cells $d_1+d_2+\ldots+d_n$ is large.

Suppose the input data is a vector $(v_1, v_2, \ldots, v_{d_1+d_2+\ldots+dn}) \in \{0, 1, \ldots, n-1\}^{d_1+d_2+\ldots+d_n}$, where each integer $v_i$ can independently be any integer in the alphabet $\{0, 1, \ldots, n-1\}$. (Note that coding schemes for such vectors have been extensively studied in the past.) We would like to change it into a "similar" permutation so that we can store it using the compressed rank modulation scheme, and use a small amount of metadata to remember how the change happened.

The key is to rebalance the vector in an efficient way so that it becomes a permutation with the required weight distribution $(d_1, d_2, \ldots, d_n)$. The approach is illustrated with the following example.

Example 5

Let n=4 and $d_1=d_2=d_3=d_4=5$. Suppose we have a codeword of $(d_1+d_2+d_3+d_4) \log_2 n=40$ bits:

10 01 00 11 01 10 11 01 11 11 10 01 01 10 11 11 00 00 01 10

Such a codeword can be easily converted to a vector $(v_1, v_2, \ldots, v_2) \in \{0,1,2,3\}^{20}$ with the simple mapping: 00→0, 01→1, 10→2, 11→3, and get 2 1 0 3 1 2 3 1 3 3 2 1 1 2 3 3 0 0 1 2

(Certainly, we may also choose to use a Gray code for the mapping. But that is not related to our discussion here.)

To get a permutation where each of the n=4 ranks has 5 cells, we can do it in three steps. First, we transform it to a codeword where the number of 0s or 1s equals the number of 2s or 3s. By inverting the first i=1 cell (where we change 0 to 3, change 1 to 2, change 2 to 1, and change 3 to 0), we get 1 1 0 3 1 2 3 1 3 3 2 1 1 2 3 3 0 0 1 2 which has 10 0s or 1s, and 10 2s or 3s.

The subsequence that contains 0s or 1s in the above codeword is 1 1 0 1 1 1 1 0 0 1

To make it balanced, we invert the first i=2 cells (where we change 0 to 1, and change 1 to 0), and get 0 0 0 1 1 1 1 0 0 1

The subsequence that contains 2s or 3s in the above codeword is 3 2 3 3 3 2 2 3 3 2

To make it balanced, we invert the first i=1 cell (where we change 2 to 3, and change 3 to 2), and get 2 2 3 3 3 2 2 3 3 2

We merge the above two subsequences based on their original positions, and get 0 0 0 2 1 2 3 1 3 3 2 1 1 2 3 3 0 0 1 2

We can now store it as a compressed rank modulation code, where each of the n=4 ranks has 5 cells.

The additional information about the inverting—namely, i=1, i=2 and i=1–can be stored as meta-data in additional cells (possibly using compressed rank modulation as well). (Note that in the above example, the mapping used in inverting cell levels is not unique. For example, we can change 0 to 2 instead of 3, or change 1 to 3 instead of 2, etc. (The key is to switch $\{0,1\}$ with $\{2,3\}$ when inverting cells.))

So we can see that it is feasible to represent existing codes—e.g., BCH codes, Reed-Solomon codes, LDPC codes, and other codes—with compressed rank modulation. The system model is shown in FIG. 13.

5. Record Weights

We now discuss an alternative approach. Suppose the input data is a vector $(v_1, v_2, \ldots, v_{d_2+d_2+\ldots+d_n}) \in \{0, 1, \ldots, n-1\}^{d_1+d_2+\ldots+d_n}$, where each integer $v_i$ can independently be any integer in the alphabet $\{0, 1, \ldots, n-1\}$. For $i=0, 1, \ldots, n-1$, let $d_{i+1}$ denote the number of entries in the vector that are equal to i; that is, $d_{i+1} = |\{j | 1 \le j \le d_1+d_2+\ldots+d_n, v_j=i\}|$. We record the weight distribution $(d_1, d_2, \ldots, d_n)$ as metadata. And then, we can store the vector directly as a compressed rank modulation permutation. (If any of the $d_i$'s happens to be 0, the compressed rank modulation scheme can be extended easily to cover this case.)

Examples

Figure 14A:
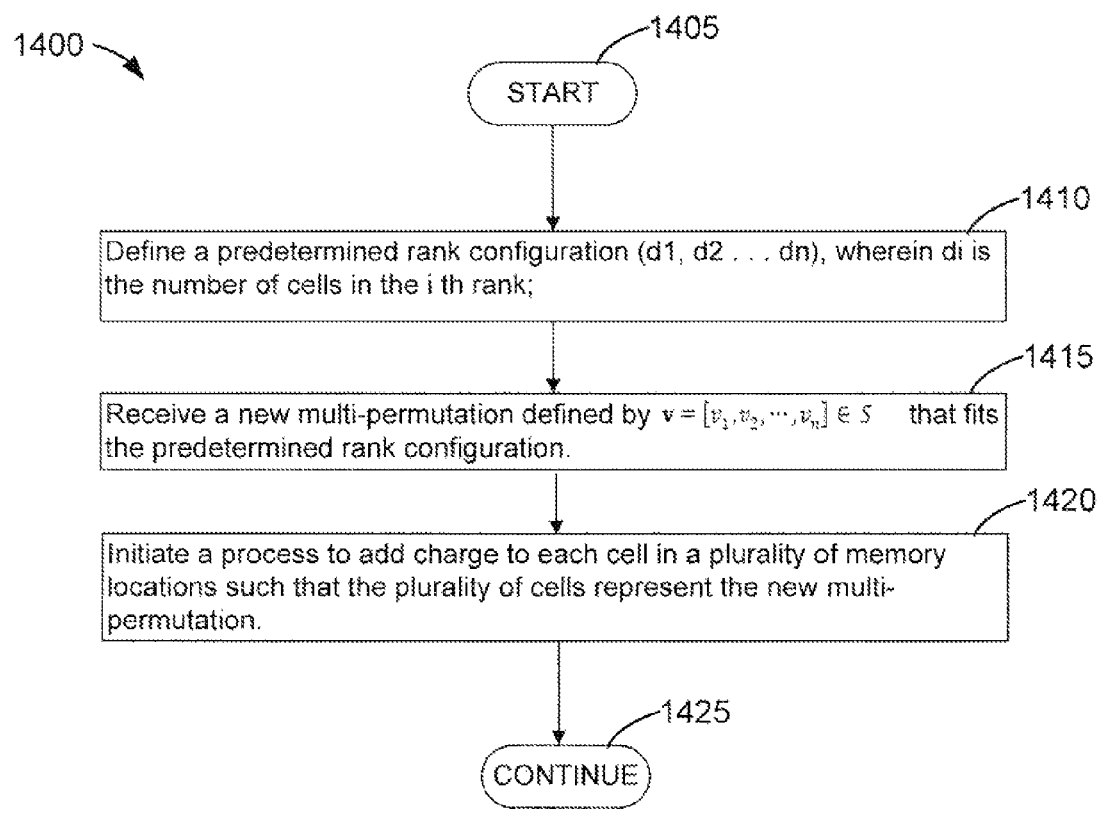
FIG. 14A is a process for operating a data device in accordance with the description herein.

FIG. 14A depicts a process 1400 for operating a data device. The process 1400 may include one or more operations, actions, or functions as illustrated by one or more of blocks 1405, 1410, 1415, 1420, and 1425. Although illustrated as discrete blocks, various blocks may be divided into additional blocks, combined into fewer blocks, or eliminated, depending on the particular implementation. The process starts with block 1405. In block 1410 a predetermined rank configuration $(d_1, d_2 \ldots d_n)$ is defined, wherein $d_i$ is the number of cells in the $i^{th}$ rank. In block 1415, a new multi-permutation is received and defined by $v=[v_1, v_2, \ldots, v_n] \in S$ that fits the predetermined rank configuration. In block 1420 a process is initiated in response to receiving the new multi-permutation, adding charge to each cell in a plurality of memory locations such that the plurality of cells represent the new multi-permutation. In block 1425 the process may be continued.

Figure 14B:
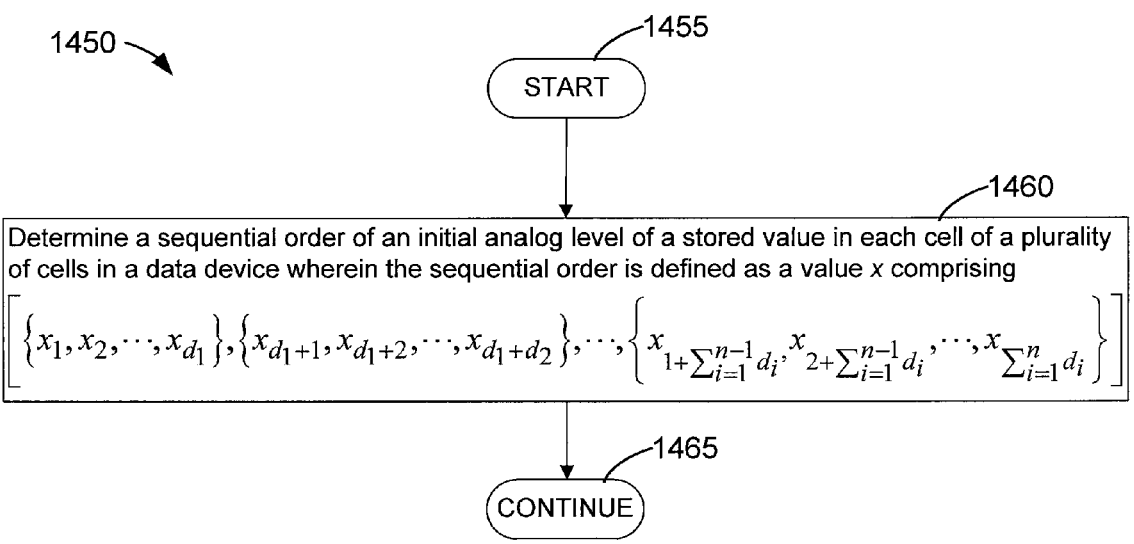
FIG. 14B is a process for reading a data device in accordance with the description herein.

FIG. 14B depicts a process 1450 for reading a data device. The process 1450 starts with block 1455. In block 1460 the sequential order of an initial analog level of a stored value in each cell of a plurality of cells in a data device is determined. The sequential order is defined as a value x comprising $[\{x_1, x_2, \ldots, x_{d_1}\}, \{x_{d_1+1}, x_{d_1+2}, \ldots, x_{d_1+d_2}\}, \ldots, \{x_{1+\Sigma_{i=1}^{n-1}d_i}, x_{2+\Sigma_{i=1}^{n-1}d_i}, \ldots, x_{\Sigma_{i=1}^{n}d_i}\}]$. In block 1465 the process may be continued.

Figure 15:
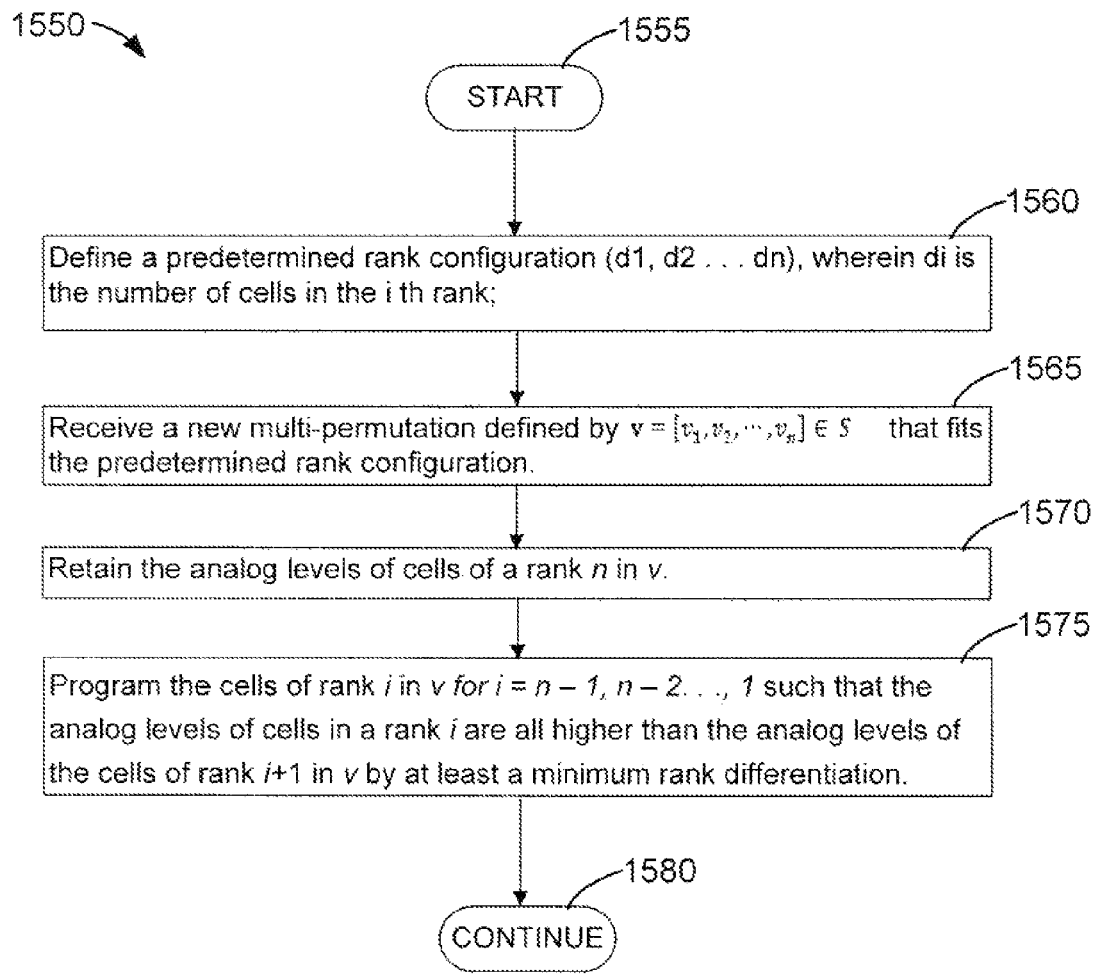
FIG. 15 is a process for writing to a data device in accordance with the description herein.

FIG. 15A depicts a process 1500 for writing to a data device. The process 1500 may include one or more operations, actions, or functions as illustrated by one or more of blocks 1505, 1507, 1509, 1511, 1513, and 1515. Although illustrated as discrete blocks, various blocks may be divided into additional blocks, combined into fewer blocks, or eliminated, depending on the particular implementation. The process starts with block 1505. In block 1507 a predetermined rank configuration $(d_1, d_2 \ldots d_n)$ is defined, wherein $d_i$ is the number of cells in the $i^{th}$ rank. In block 1509, a new multi-permutation is received and defined by $v=[v_1, v_2, \ldots, v_n] \in S$ that fits the predetermined rank configuration. In block 1511 the analog levels of cells of a rank n in v are retained. In block 1513 the cells of rank i in v for I=n–1, n–2 . . . , 1 such that the analog levels of cells in a rank i are programmed to all be higher than the analog levels of the cells of rank i+1 in v by at least a minimum rank differentiation. In block 1515 the process may be continued.

V. EXAMPLE EMBODIMENTS

Figure 16:
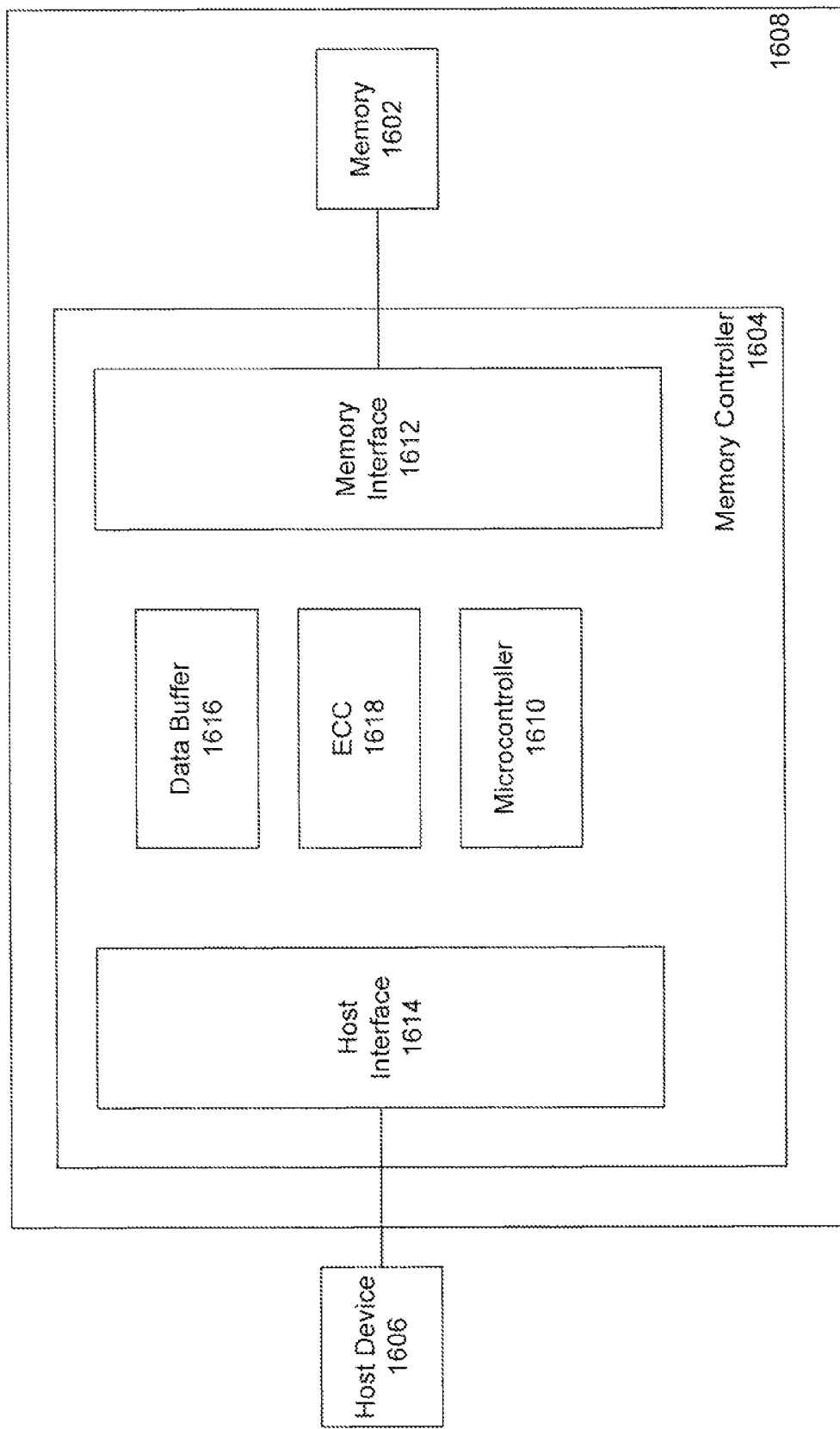
FIG. 16 is an illustration of a memory device constructed in accordance with the present invention.

FIG. 16 is an illustration of one embodiment of a data device constructed in accordance with the present invention. FIG. 16 shows a memory 1602 that is accessed by a memory controller 1604 that communicates with a host device 1606. The memory 1602 is used for storing data that is represented in accordance with a minimum push up, multi-cell or multi-permutation scheme. The memory may be implemented, for example, as a Flash memory having multilevel cells. The memory 1602 and memory controller 1604 together comprise a data storage device 1608 that may be external to the host device or may be integrated with the host device into a single component or system. For example, the data storage device 1608 may comprise a Flash memory device (often referred to as a "thumb drive") that communicates with a host computer 1606 via a USB connection, or the data storage device may comprise a solid state drive (SSD) that stores data for a host computer system. Alternatively, the data storage device may be integrated with a suitable host device to comprise a single system or component with memory employing a minimum push up, a multi-cell or a multi-permutation scheme, such as a smart phone, network router, MP3 player, or the like.

The memory controller 1604 operates under control of a microcontroller 1610, which manages communications with the memory 1602 via a memory interface 1612 and manages communications with the host device via a host interface 1614. Thus, the memory controller supervises data transfers from the host 1606 to the memory 1602 and from the memory 1602 to the host 1606. The memory controller 1604 also includes a data buffer 1616 in which data values may be temporarily stored for transmission over the data channel controller 1617 between the memory 1602 and the host 1606. The memory controller also includes an Error Correcting code (ECC) block 1618 in which data for the ECC is maintained. For example, the ECC block 1618 may comprise data and program code to perform error correction operations for a minimum push up, a multi-cell or a multi-permutation scheme. Such error correction operations are described, for example, in the U.S. patent application entitled "Error Correcting Codes for Rank Modulation" by Anxiao Jiang et al. filed Nov. 20, 2008. The ECC block 1618 may contain parameters for the error correction code to be used for the memory 1602, such as programmed operations for translating between received symbols and error-corrected symbols, or the ECC block may contain lookup tables for codewords or other data, or the like. The memory controller 1604 performs the operations described above for decoding data and for encoding data.

The operations described above for operating a data storage device, for reading data from a device, for programming a data storage device, and encoding and decoding, can be carried out by the operations depicted in FIGS. 6, 8A, 8B, 14 and 15 which can be performed by the microcontroller 1610 and associated components of the data storage device 1608. For example, in an implementation of the rank modulation coding scheme in a USB thumb drive, all the components of the data storage device 1608 depicted in FIG. 16 are contained within the USB thumb drive.

Figure 17:
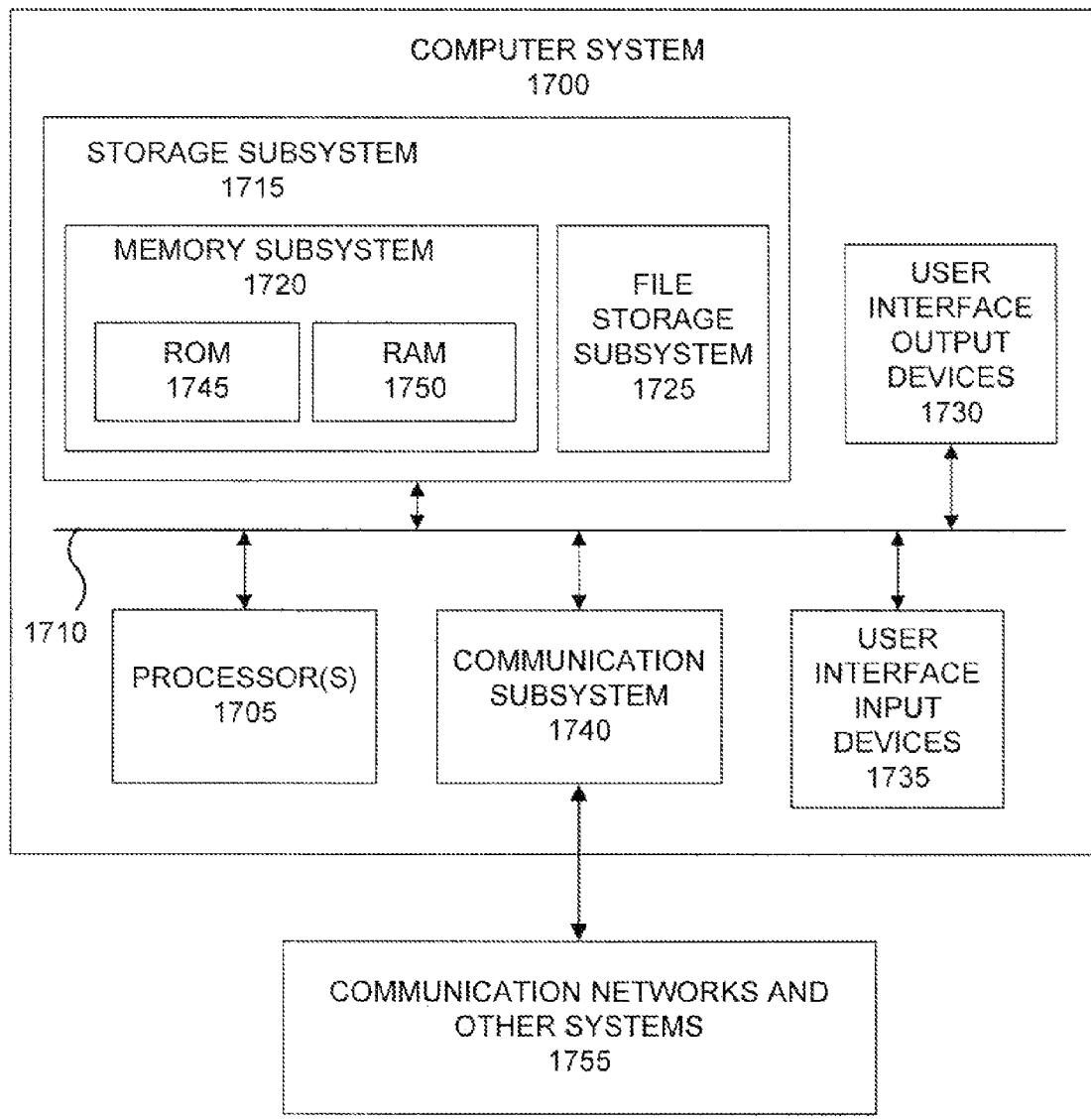
FIG. 17 is a block diagram of a computer apparatus to perform the operations of FIGS. 6, 8A, 8B, 14 and 15 for communicating with a memory device such as depicted in FIG. 16.

The processing components such as the controller 1604 and microcontroller 1610 may be implemented in the form of control logic in software or hardware or a combination of both, and may comprise processors that execute software program instructions from program memory, or as firmware, or the like. The host device 1606 may comprise a conventional computer apparatus. A conventional computer apparatus also may carry out the operations of FIGS. 6, 8A, 8B, 14 and 15. FIG. 17 is a block diagram of a computer apparatus 1700 sufficient to perform as a host device and sufficient to perform the operations of FIGS. 6, 8A, 8B, 14 and 15.

FIG. 17 is a block diagram of a computer system 1700 that may incorporate embodiments of the present invention and perform the operations described herein. The computer system 1700 typically includes one or more processors 1705, a system bus 1710, storage subsystem 1715 that includes a memory subsystem 1720 and a file storage subsystem 1725, user interface output devices 1730, user interface input devices 1735, a communications subsystem 1740, and the like.

In various embodiments, the computer system 1700 typically includes conventional computer components such as the one or more processors 1705. The file storage subsystem 1725 can include a variety of memory storage devices, such as a read only memory (ROM) 1745 and random access memory (RAM) 1750 in the memory subsystem 1720, and direct access storage devices such as disk drives. As noted, the direct access storage device may comprise a rank modulation data storage device that operates as described herein.

The user interface output devices 1730 can comprise a variety of devices including flat panel displays, touchscreens, indicator lights, audio devices, force feedback devices, and the like. The user interface input devices 1735 can comprise a variety of devices including a computer mouse, trackball, trackpad, joystick, wireless remote, drawing tablet, voice command system, eye tracking system, and the like. The user interface input devices 1735 typically allow a user to select objects, icons, text and the like that appear on the user interface output devices 1730 via a command such as a click of a button or the like.

Embodiments of the communication subsystem 1740 typically include an Ethernet card, a modem (telephone, satellite, cable, ISDN), (asynchronous) digital subscriber line (DSL) unit, FireWire (IEEE 1394) interface, USB interface, and the like. For example, the communications subsystem 1740 may be coupled to communications networks and other external systems 1755 (e.g., a network such as a LAN or the Internet), to a FireWire bus, or the like. In other embodiments, the communications subsystem 1740 may be physically integrated on the motherboard of the computer system 1700, may be a software program, such as soft DSL, or the like.

The RAM 1750 and the file storage subsystem 1725 are examples of tangible media configured to store data such as error correction code parameters, codewords, and program instructions to perform the operations described herein when executed by the one or more processors, including executable computer code, human readable code, or the like. Other types of tangible media include program product media such as floppy disks, removable hard disks, optical storage media such as CDs, DVDs, and bar code media, semiconductor memories such as flash memories, read-only-memories (ROMs), battery-backed volatile memories, networked storage devices, and the like. The file storage subsystem 1725 includes reader subsystems that can transfer data from the program product media to the storage subsystem 1715 for operation and execution by the processors 1705.

The computer system 1700 may also include software that enables communications over a network (e.g., the communications network 1755) such as the DNS, TCP/IP, UDP/IP, and HTTP/HTTPS protocols, and the like. In alternative embodiments, other communications software and transfer protocols may also be used, for example IPX, or the like.

It will be readily apparent to one of ordinary skill in the art that many other hardware and software configurations are suitable for use with the present invention. For example, the computer system 1700 may be a desktop, portable, rack-mounted, or tablet configuration. Additionally, the computer system 1700 may be a series of networked computers. Further, a variety of microprocessors are contemplated and are suitable for the one or more processors 1705, such as PENTIUM™ microprocessors from Intel Corporation of Santa Clara, Calif., USA; OPTERON™ or ATHLON XP™ microprocessors from Advanced Micro Devices, Inc. of Sunnyvale, Calif., USA; and the like. Further, a variety of operating systems are contemplated and are suitable, such as WINDOWS®, WINDOWS XP®, WINDOWS VISTA®, or the like from Microsoft Corporation of Redmond, Wash., USA, SOLARIS® from Sun Microsystems, Inc. of Santa Clara, Calif., USA, various Linux and UNIX distributions, and the like. In still other embodiments, the techniques described above may be implemented upon a chip or an auxiliary processing board (e.g., a programmable logic device or graphics processor unit).

The present invention can be implemented in the form of control logic in software or hardware or a combination of both. The control logic may be stored in an information storage medium as a plurality of instructions adapted to direct an information-processing device to perform a set of steps disclosed in embodiments of the present invention. Based on the disclosure and teachings provided herein, a person of ordinary skill in the art will appreciate other ways and/or methods to implement the present invention.

The a minimum push up, multi-cell and multi-permutation schemes described herein can be implemented in a variety of systems for encoding and decoding data for transmission and storage. That is, codewords are received from a source over an information channel according to a minimum push up, a multi-cell or a multi-permutation scheme and are decoded into their corresponding data values and provided to a destination, such as a memory or a processor, and data values for storage or transmission are received from a source over an information channel and are encoded into a minimum push up, multi-cell or multi-permutation scheme.

Figure 18:
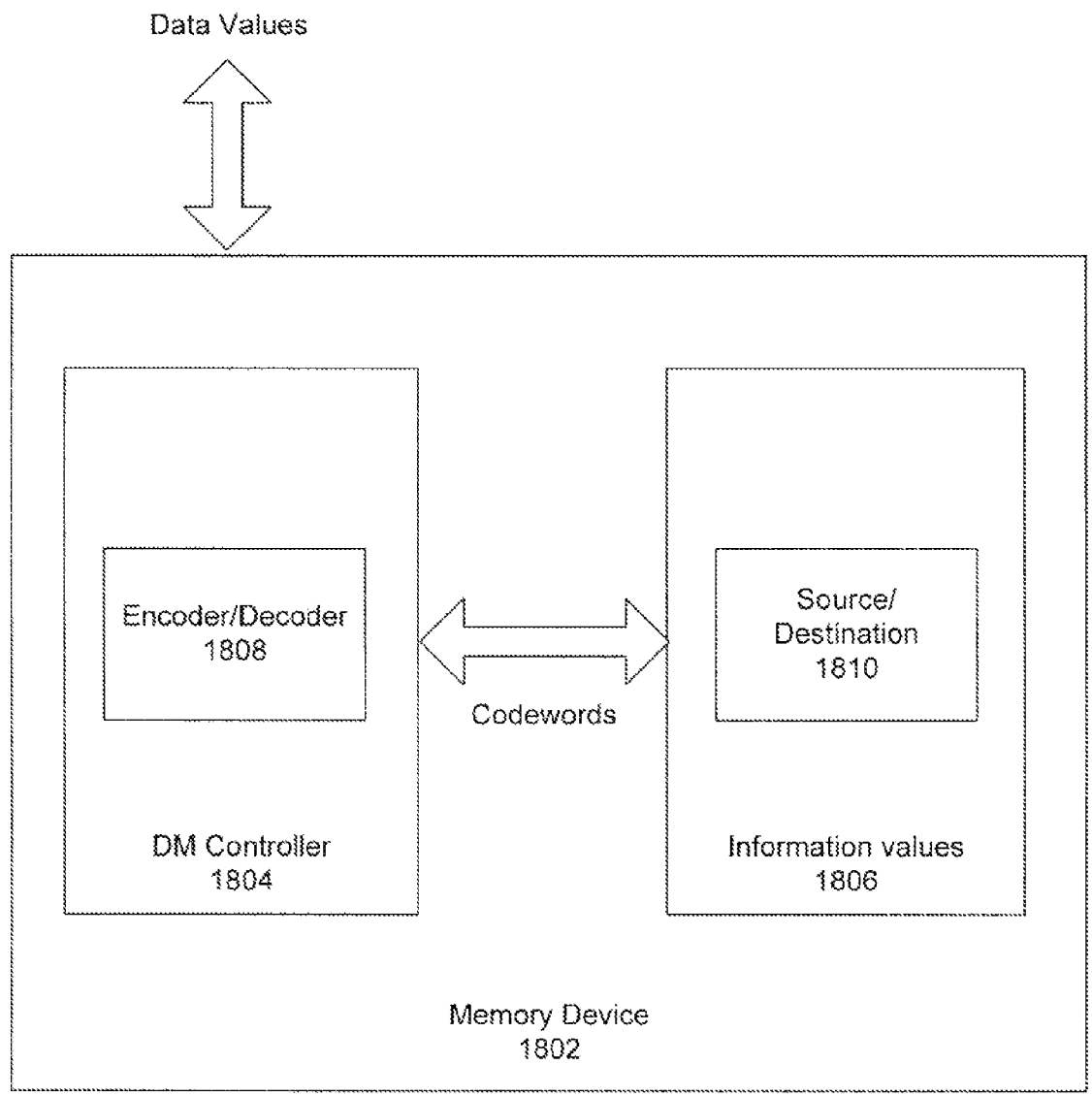
FIG. 18 is a block diagram that shows data flow in a memory device that operates according to the rank modulation scheme described herein.

The operations of encoding and decoding data according to a minimum push up, multi-cell or multi-permutation scheme can be illustrated as in FIG. 18, which shows data flow in a data device 1802 that operates according to the minimum push up, multi-cell or multi-permutation schemes described herein. In FIG. 18, the device includes a Data Modulation (DM) controller 1804 that stores and retrieves information values 1806 using one of a minimum push up, multi-cell or a multi-permutation scheme. The DM controller 1804 includes an encoder and decoder 1808 for encoding data values into codewords and decoding codewords into data values. The DM controller encodes data values and provides codewords to the source/destination block 1810, and decodes codewords from the source/destination and provides corresponding data values. The two-way nature of the data flow is indicated by the double-ended arrows labeled "data values" and "codewords". The DM controller includes interfaces through which the DM controller receives and provides the data values and the information values (codewords). The details of such interfaces will be known to those skilled in the art.

The information values 1806 comprise the means for physically representing data comprising the data values and codewords. For example, the information values 1806 may represent charge levels of memory cells, such that multiple cells are configured to operate as a virtual cell in which charge levels of the cells determine a permutation of the minimum push up, multi-cell or multi-permutation schemes. Data values are received and encoded to permutations of a a minimum push up, multi-cell or multi-permutation scheme and charge levels of cells are adjusted accordingly, and codewords are determined according to cell charge levels, from which a corresponding data value is determined. Alternatively, the information values 1806 may represent features of a transmitted signal, such as signal frequency, magnitude, or duration, such that the cells or bins are defined by the signal features and determine a permutation of the minimum push up, multi-cell or multi-permutation schemes. For example, rank ordering of detected cell frequency changes over time can determine a permutation, wherein the highest signal frequency denotes the highest cell level. Other schemes for physical representation of the cells will occur to those skilled in the art, in view of the description herein.

For information values 1806 in the case of cell charge levels, the source/destination 1810 comprises memory cells in which n memory cells provide n cell values whose charge levels define a a minimum push up, multi-cell or multi-permutation scheme. For storing a codeword, the memory cells receive an encoded codeword and comprise a destination, and for reading a codeword, the memory cells provide a codeword for decoding and comprise a source. In the case of data transmission, the source/destination 1810 may comprise a transmitter/receiver that processes a signal with signal features such as frequency, magnitude, or duration that define cells or bins such that the signal features determine a permutation. That is, signal components comprising signal frequency, magnitude, or duration may be controlled and modulated by the transmitter such that a highest signal frequency component or greatest magnitude component or greatest time component corresponds to a highest cell level, followed by signal component values that correspond to other cell values and thereby define a permutation of the minimum push up, multi-cell or multi-permutation schemes. When the source/destination 1810 receives a codeword from the controller 1804, the source/destination comprises a transmitter of the device 1802 for sending an encoded signal. When the source/destination provides a codeword to the controller 1804 from a received signal, the source/destination comprises a receiver of the device for receiving an encoded signal. Those skilled in the art will understand how to suitably modulate signal components of the transmitted signal to define minimum push up, multi-cell or multi-permutation schemes, in view of the description herein.

VI. CONCLUSION

We have presented a programming method that minimizes rewriting cost for rank modulation, and studied rewrite codes for a worst-case constraint on the cost. The presented codes are optimal full-assignment codes. It remains our future research to extend the code constructions to general code length, non-full assignment codes and average-case cost constraint.

We have also presented a new flash cell structure (multi-cell) that enables a high number of updates between block erasures. We studied update codes that are based on permutations of relative levels, and presented an asymptotically optimal construction for the average case. In addition, we showed that there exists an asymptotically optimal construction for the worst case. It remains an open problem to construct such a code for the worst case.

The embodiments discussed herein are illustrative of one or more examples of the present invention. As these embodiments of the present invention are described with reference to illustrations, various modifications or adaptations of the methods and/or specific structures described may become apparent to those skilled in the art. All such modifications, adaptations, or variations that rely upon the teachings of the present invention, and through which these teachings have advanced the art, are considered to be within the scope of the present invention. Hence, the present descriptions and drawings should not be considered in a limiting sense, as it is understood that the present invention is in no way limited to only the embodiments illustrated.

We claim:

1. A method of operating a data device, the method comprising:
   receiving a data value $v=[v_1, v_2, \ldots, v_n] \in S_n$ wherein v is an element of S, and S is a set of symbols in a rank modulation coding scheme and n is a number of ranks in v to be stored in a group of n rank locations in data storage of the data device containing current values $U=[u_1, u_2, \ldots, u_n] \in S_n$;
   programming the group of n rank locations according to the rank modulation coding scheme and the value v such that for $i=n-1, n-2, \ldots, 1$ the programmed value of a rank location $v_i$ is increased until it is greater than the value of a rank location $v_{i+1}$ by a minimum cell differentiation amount.

2. A method as in claim 1 wherein each of the n rank locations comprises a cell of the device data storage.

3. A method as in claim 1 wherein each rank location comprises a plurality of cells of the device data storage.

4. A method as in claim 3, wherein each rank location comprises an equal number of cells of the device data storage.

5. A method as in claim 3, wherein programming comprises increasing the value of all cells in the rank location $v_i$ until the value in each of the cells $v_i$ is greater than the value in each of the cells in the rank location $v_{i+1}$.

6. A method as in claim 1 wherein the current values of $u=[u_1, u_2, \ldots, u_n] \in S_n$ are read from the device data storage before the programming of the group of n rank locations with v.

7. A memory controller comprising:
   an interface that receives a new data set for a rank of a plurality of ranks to be stored in a memory comprising a plurality of cells;
   a processor configured to perform operations of:
     receiving a data value $v=[v_1, v_2, \ldots, v_n] \in S_n$ wherein v is an element of S, and S is a set of symbols in a rank modulation coding scheme and n is a number of ranks in v to be stored in a group of n rank locations in data storage of the data device containing current values $u=[u_1, u_2, \ldots, u_n] \in S_n$;

programming the group of n rank locations according to the rank modulation coding scheme and the value v such that for i=n−1, n−2, ..., 1 the programmed value of a rank location $v_i$ is increased until it is greater than the value of a rank location $v_{i+1}$ by a minimum cell differentiation amount.

8. A memory controller as in claim 7, wherein each of the n rank locations comprises a cell of the device data storage.

9. A memory controller as in claim 7, wherein each rank location comprises a plurality of cells of the device data storage.

10. A memory controller as in claim 9, wherein each rank location comprises an equal number of cells of the device data storage.

11. A memory controller as in claim 9, wherein programming comprises increasing the value of all cells in the rank location $v_i$ until the value in each of the cells $v_i$ is greater than the value in each of the cells in the rank location $v_{i+1}$.

12. A memory controller as in claim 7, wherein the current values of $u=[u_1, u_2, \ldots, u_n] \in S_n$ are read from the device data storage before the programming of the group of n rank locations with v.

13. A data device comprising:
a memory configured to store data values:
a memory controller that is configured to store the data values in the memory by performing operations comprising:

receiving a data value $v=[v_1, v_2, \ldots, V_n] \in S_n$ wherein v is an element of S, and S is a set of symbols in a rank modulation coding scheme and n is a number of ranks in v to be stored in a group of n rank locations in data storage of the data device containing current values $u=[u_1, u_2, \ldots, u_n] \in S_n$;

programming the group of n rank locations according to the rank modulation coding scheme and the value v such that for i=n−1, n−2, ..., 1 the programmed value of a rank location $v_i$ is increased until it is greater than the value of a rank location $v_{i+1}$ by a minimum cell differentiation amount.

14. A data device as in claim 13, wherein each of the n rank locations comprises a cell of the device data storage.

15. A data device as in claim 13, wherein each rank location comprises a plurality of cells of the device data storage.

16. A data device as in claim 15, wherein each rank location comprises an equal number of cells of the device data storage.

17. A data device as in claim 15, wherein programming comprises increasing the value of all cells in the rank location $v_i$ until the value in each of the cells $v_i$ is greater than the value in each of the cells in the rank location $v_{i+1}$.

18. A data device as in claim 13, wherein the current values of $u=[u_1, u_2, \ldots, u_n] \in S_n$ are read from the device data storage before the programming of the group of n rank locations with v.

* * * * *